(12) United States Patent
Etou et al.

(10) Patent No.: US 11,418,750 B2
(45) Date of Patent: Aug. 16, 2022

(54) IMAGING ELEMENT AND ELECTRONIC DEVICE

(71) Applicant: Sony Semiconductor Solutions Corporation, Kanagawa (JP)

(72) Inventors: Shinichirou Etou, Kanagawa (JP); Yusuke Ikeda, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 49 days.

(21) Appl. No.: 16/977,026

(22) PCT Filed: Apr. 3, 2019

(86) PCT No.: PCT/JP2019/014752
§ 371 (c)(1),
(2) Date: Aug. 31, 2020

(87) PCT Pub. No.: WO2019/198586
PCT Pub. Date: Oct. 17, 2019

(65) Prior Publication Data
US 2020/0412994 A1  Dec. 31, 2020

(30) Foreign Application Priority Data

Apr. 10, 2018 (JP) .............................. JP2018-075211
Oct. 12, 2018 (JP) .............................. JP2018-193116

(51) Int. Cl.
*H04N 5/378* (2011.01)
*H03M 1/08* (2006.01)
*H04N 5/363* (2011.01)

(52) U.S. Cl.
CPC .............. *H04N 5/378* (2013.01); *H03M 1/08* (2013.01); *H04N 5/363* (2013.01)

(58) Field of Classification Search
CPC .......... H04N 5/378; H04N 5/363; H03M 1/08
See application file for complete search history.

(56) References Cited

U.S. PATENT DOCUMENTS

| 2015/0077607 A1* | 3/2015 | Yamazaki | H04N 5/378 348/301 |
| 2017/0195590 A1* | 7/2017 | Bulteel | H04N 5/378 |
| 2018/0183454 A1* | 6/2018 | Lee | H03M 1/145 |

FOREIGN PATENT DOCUMENTS

| CN | 104469202 A | 3/2015 |
| JP | 2013239951 A | 11/2013 |
| JP | 2017-046318 A | 3/2017 |

OTHER PUBLICATIONS

Extended European Search Report dated Jul. 23, 2021 for corresponding European Application No. 19786059.6.
(Continued)

*Primary Examiner* — Twyler L Haskins
*Assistant Examiner* — Fayez A Bhuiyan
(74) *Attorney, Agent, or Firm* — Michael Best & Friedrich LLP

(57) ABSTRACT

An imaging element according to a first aspect includes: a successive approximation resistor type analog-digital converter that converts an analog signal output from a pixel including a photoelectric conversion part into a digital signal, in which the successive approximation resistor type analog-digital converter has a preamplifier having a band limiting function. An imaging element according to a second aspect includes a DAC in which the successive approximation resistor type analog-digital converter uses a capacitance element to convert a digital value after AD conversion to an analog value, and sets the analog value to a comparison reference for comparison with an analog input voltage. Then, the DAC includes one of lower-bit capacitance elements including a plurality of capacitance elements, and after performing AD conversion for all bits, each of the plurality of capacitance elements is selectively applied with at least a first reference voltage to a fourth reference voltage, so that re-AD conversion is performed for lower bits.

14 Claims, 18 Drawing Sheets

(56) References Cited

OTHER PUBLICATIONS

Wang Shenjie et al., "Design and Implementation of a Rail-to-Rail 460-kS/s 10-bit SAR ADC for the Power-Efficient Capacitance Measurement", IEEE Transactions on Instrumentation and Measurement, IEEE Service Center, Piscataway, NJ, US, vol. 64, No. 4, Apr. 1, 2015 (Apr. 1, 2015), pp. 888-901, XP011574456, ISSN: 0018-9456, DOI: 10.1109/TIM.2014.2365405 [retrieved on Mar. 6, 2015] * p. 896-p. 897; figures 19-21 *.

Pieter Harpe et al., "A 7-to-1 Ob 0-to-4MS/s flexible SAR ADC with 6.5-to-16f J/conversion-step", Solid-State Circuits Conference Digest of Technical Papers (ISSCC), 2012 IEEE International, IEEE, Feb. 19, 2012 (Feb. 19, 2012), pp. 472-474, XP032154548, DOI: 10.1109/ISSCC.2012.6177096 ISBN 978-1-4673-0376-7 * p. 472-p. 473; figures 27.8.1,27.8.2 *.

* cited by examiner

IMAGING ELEMENT AND ELECTRONIC DEVICE

TECHNICAL FIELD

The present disclosure relates to an imaging element and an electronic device.

BACKGROUND ART

An imaging element is equipped with an analog-digital converter that converts an analog signal (pixel signal) output from a pixel into a digital signal, and as the analog-digital converter, a successive approximation resistor (SAR) type analog-digital converter is used (for example, see Patent Document 1). The successive approximation resistor type analog-digital converter has an advantage that it can perform analog-digital conversion at high speed with low noise.

CITATION LIST

Patent Document

Patent Document 1: Japanese Patent Application Laid-Open No. 2017-46318

SUMMARY OF THE INVENTION

Problems to be Solved by the Invention

An object of the present disclosure is to provide an imaging element including a successive approximation resistor type analog-digital converter capable of performing analog-digital conversion with lower noise, and an electronic device including the imaging element.

Solutions to Problems

An imaging element according to a first aspect of the present disclosure for achieving the object described above includes:

a successive approximation resistor type analog-digital converter that converts an analog signal output from a pixel including a photoelectric conversion part into a digital signal, in which the successive approximation resistor type analog-digital converter has a preamplifier having a band limiting function. The imaging element according to the first aspect can be used in an electronic device.

An imaging element according to a second aspect of the present disclosure for achieving the object described above includes a successive approximation resistor type analog-digital converter that converts an analog signal output from a pixel including a photoelectric conversion part into a digital signal, in which the successive approximation resistor type analog-digital converter has a digital-analog converter that uses a capacitance element to convert a digital value after analog-digital conversion to an analog value, and sets the analog value to a comparison reference for comparison with an analog input voltage, and in the digital-analog converter, one of capacitance elements of lower bits includes a plurality of capacitance elements, and after the analog-digital conversion is performed for all bits, at least a first reference voltage to a fourth reference voltage are selectively applied to each of the plurality of capacitance elements, so that the analog-digital conversion is performed again for the lower bits. The imaging element according to the second aspect can be used in an electronic device.

MODE FOR CARRYING OUT THE INVENTION

Figure 1:
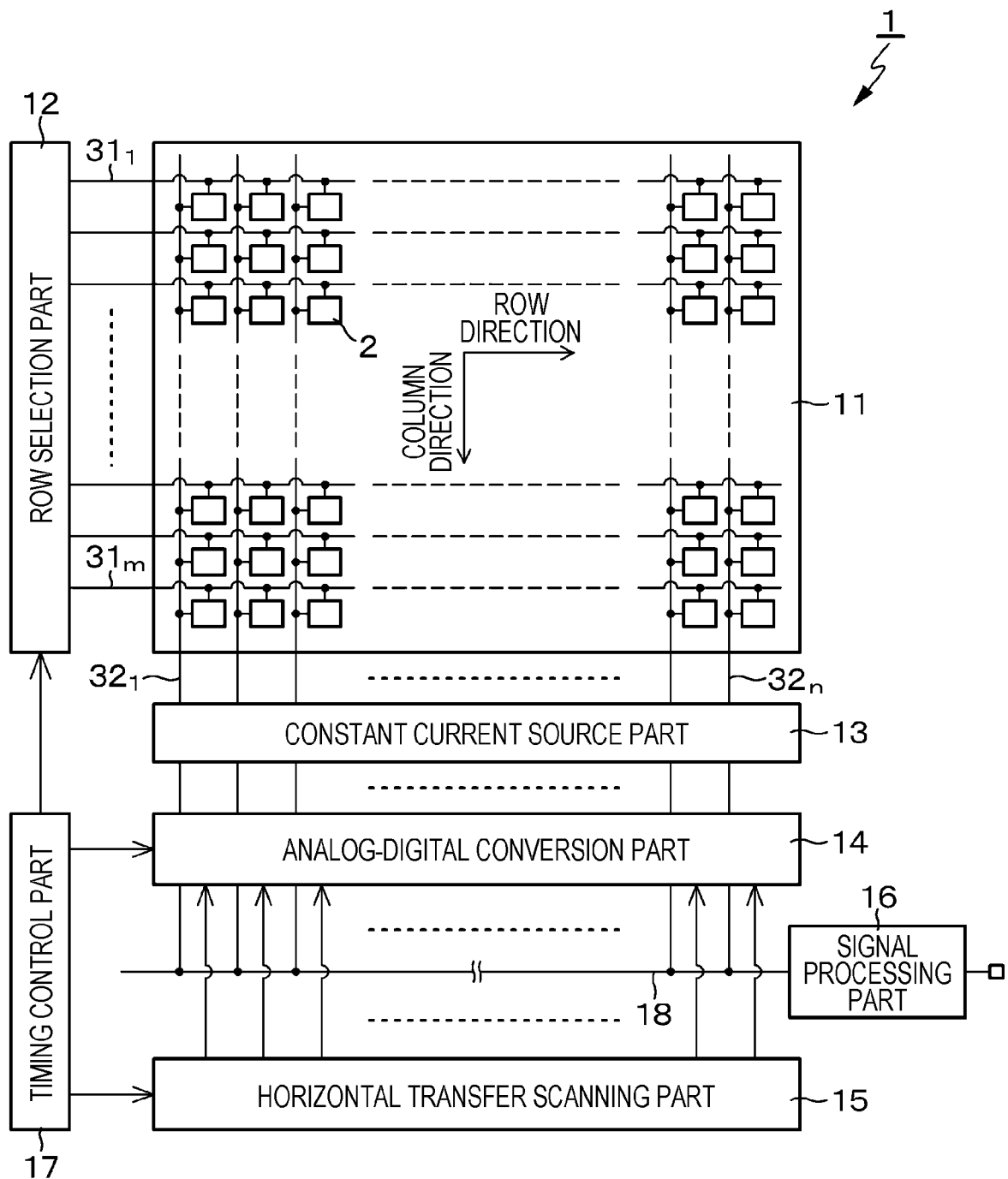
FIG. 1 is a block diagram showing an outline of a basic configuration of a CMOS image sensor which is an example of an imaging element of the present disclosure.

Hereinafter, modes (hereinafter, referred to as "embodiments") for implementing the technology according to the present disclosure will be described in detail with reference to the drawings. The technology according to the present disclosure is not limited to the embodiments. In the following description, the same reference numerals will be used for the same elements or elements having the same function, and redundant description will be omitted. Note that the description will be given in the following order.

1. General explanation of imaging element and electronic device of the present disclosure
2. Imaging element of the present disclosure
2-1. CMOS image sensor configuration example
2-2. Pixel configuration example
2-3. Chip structure
2-3-1. Flat type chip structure (so-called flat type structure)
2-3-2. Stacked type chip structure (so-called stacked structure)
3. Embodiment of present disclosure
3-1. First embodiment
3-2. Second embodiment
3-3. Third embodiment
3-4. Fourth embodiment
4. Modification
5. Application example
6. Application example of technology according to the present disclosure
6-1. Electronic device of the present disclosure (example of imaging device)
6-2. Application to indirect TOF distance image sensor
6-2-1. System configuration example
6-2-2. Pixel configuration example
6-3. Application example to mobile body
7. Configuration that the present disclosure can have <General Explanation of Imaging Element and Electronic Device of the Present Disclosure>

In an imaging element and an electronic device according to a first aspect of the present disclosure, a successive approximation resistor type analog-digital converter can have a configuration including a digital-analog converter that uses a capacitance element to convert a digital value after analog-digital conversion to an analog value, and sets the analog value to a comparison reference for comparison with an analog input voltage. The digital-analog converter can have a configuration having a plurality of additional capacitance elements for performing analog-digital conversion again, or a configuration in which one of capacitance elements of lower bits includes a plurality of capacitance elements. Then, the digital-analog converter can have a configuration in which analog-digital conversion is performed for all bits and then analog-digital conversion is performed again for lower bits, or analog-digital conversion is performed for all bits and then at least a first reference voltage to a fourth reference voltage are applied to each of a plurality of capacitance elements so that analog-digital conversion can be performed again for lower bits.

In the imaging element and the electronic device of the present disclosure including the above-described preferable configuration, a preamplifier can have a configuration in which band limitation is performed at least during a period for performing the analog-digital conversion again, or a configuration in which band limitation is performed only during the period in which the analog-digital conversion is performed again.

Furthermore, the imaging element and the electronic device of the present disclosure including the above-described preferable configuration, the preamplifier can have a configuration in which band limitation is performed by changing a resistance of a load, or band limitation is performed by controlling a current source bias or the number of current sources to be driven. Alternatively, the imaging element and the electronic device of the present disclosure can have a configuration in which band limitation is performed by changing an output ground capacity. Alternatively, the preamplifier can have a configuration including a variable capacitance diode connected to an output node, and can have a configuration in which band limitation is performed by controlling the capacitance of the variable capacitance diode.

In imaging element and the electronic device according to the second aspect of the present disclosure, the digital-analog converter can have a configuration in which a switch group that sequentially applies at least the first reference voltage to the fourth reference voltage to each of the plurality of capacitance elements is provided for each of the plurality of capacitance elements.

<Imaging Element of the Present Disclosure>

The basic configuration of the imaging element of the present disclosure to which the technology according to the present disclosure is applied will be described. Here, a complementary metal oxide semiconductor (CMOS) image sensor, which is a type of an X-Y address type imaging element, will be described as an example of the imaging element. The CMOS image sensor is an image sensor manufactured by applying or partially using a CMOS process.

CMOS Image Sensor Configuration Example

FIG. 1 is a block diagram showing an outline of a basic configuration of a CMOS image sensor which is an example of an imaging element of the present disclosure.

A CMOS image sensor 1 according to this example has a configuration including: a pixel array part 11 having pixels 2 including a photoelectric conversion part are two-dimensionally arranged in a row direction and a column direction, that is, in a matrix; and a periphery circuit part of the pixel array part 11. Here, the row direction means an array direction of the pixels 2 in a pixel row (so-called horizontal direction), and the column direction means an array direction of the pixels 2 in a pixel column (so-called vertical direction). The pixel 2 generates and accumulates a photocharge corresponding to the amount of received light by performing photoelectric conversion.

The peripheral circuit part of the pixel array part 11 includes, for example, a row selection part 12, a constant current source part 13, an analog-digital conversion part 14, a horizontal transfer scanning part 15, a signal processing part 16, a timing control part 17, and the like.

In the pixel array part 11, pixel drive lines $31_1$ to $31_m$ (hereinafter, sometimes collectively referred to as "pixel drive line 31") are wired along the row direction for each pixel row in the matrix of pixel arrays. Furthermore, vertical signal lines $32_1$ to $32_n$ (hereinafter, sometimes collectively referred to as "vertical signal line 32") are wired along the column direction for each pixel column. The pixel drive line 31 transmits a drive signal for driving when reading a signal from the pixel 2. In FIG. 1, the pixel drive line 31 is shown as one wiring. However, the pixel drive line 31 is not limited to one. One end of the pixel drive line 31 is connected to an output terminal corresponding to each row of the row selection part 12.

Each circuit part of the peripheral circuit part of the pixel array part 11, that is, the row selection part 12, the constant current source part 13, the analog-digital conversion part 14, the horizontal transfer scanning part 15, the signal processing part 16, and the timing control part 17 will be described below.

The row selection part 12 includes a shift register, an address decoder, and the like, and controls the scanning of the pixel row and the address of the pixel row when selecting each pixel 2 of the pixel array part 11. Although the specific configuration of the row selection part 12 is not illustrated, in general, the row selection part 12 has two scanning systems of a reading scanning system and a sweeping scanning system.

In order to read a pixel signal from the pixel 2, the reading scanning system sequentially selects and scans the pixels 2 of the pixel array part 11 in units of rows. The pixel signal read from the pixel 2 is an analog signal. In the sweeping scanning system, sweeping scan is performed ahead of reading scan by amount of time of shutter speed, with respect to a reading row where reading scan is performed by the reading scanning system.

Unnecessary charges are swept out from the photoelectric conversion part of the pixel 2 in the reading row by the sweeping scan by the sweeping scanning system, whereby the photoelectric conversion part is reset. Then, so-called electronic shutter operation is performed by sweeping out (resetting) unnecessary charges by this sweeping scanning system. Here, the electronic shutter operation refers to operation of discarding a photocharge of the photoelectric conversion part and starting new exposure (starting accumulation of a photocharge).

The constant current source part 13 includes a plurality of current sources I each including, for example, a MOS transistor, which is connected to each of the vertical signal lines $32_1$ to $32_n$ for each pixel column, and supplies a bias current to each of the pixels 2 of the pixel row that has been selected and scanned by the row selection part 12, through each of the vertical signal lines $32_1$ to $32_n$.

The analog-digital conversion part 14 includes a set of a plurality of analog-digital converters provided corresponding to the pixel columns of the pixel array part 11, for example, provided for each pixel column. The analog-digital conversion part 14 is a column parallel type analog-digital conversion part that converts an analog pixel signal output through each of the vertical signal lines $32_1$ to $32_n$ for each pixel column into an N-bit digital signal.

The horizontal transfer scanning part 15 includes a shift register, an address decoder, and the like, and controls the scanning of the pixel column and the address of the pixel column when reading the signal of each pixel 2 of the pixel array part 11. Under the control of the horizontal transfer scanning part 15, the pixel signal converted into a digital signal by the analog-digital conversion part 14 is read out to the horizontal transfer line 18 in units of pixel columns.

The signal processing part 16 performs predetermined signal processing on the digital pixel signal supplied through the horizontal transfer line 18 to generate two-dimensional image data. Examples of the predetermined signal processing include noise removal processing, for example, correlated double sampling (CDS) processing. In the CDS processing, processing is performed, the processing of taking in a reset level and a signal level output from each pixel 2 of the selected row, acquiring the signal of the pixel for one row by taking the difference between these levels, and removing the fixed pattern noise of the pixel 2. The signal processing part 16 outputs the generated image data as an output signal of the CMOS image sensor 1 to a device in the subsequent stage.

The timing control part 17 generates various timing signals, clock signals, control signals, and the like, and on the basis of these generated signals, performs drive control of the row selection part 12, the constant current source part 13, the analog-digital conversion part 14, the horizontal transfer scanning part 15, the signal processing part 16, and the like.

Pixel Circuit Configuration Example

Figure 2:
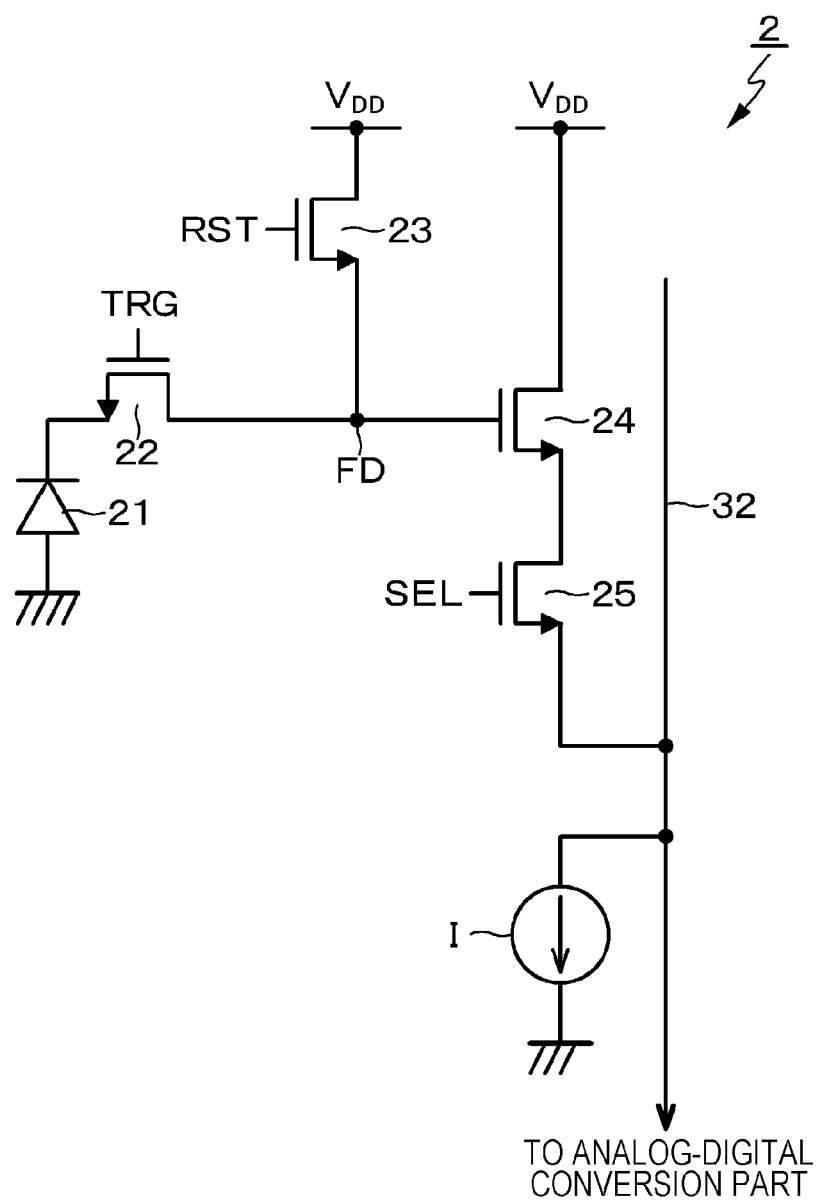
FIG. 2 is a circuit diagram showing an example of a circuit configuration of a pixel.

FIG. 2 is a circuit diagram showing an example of a circuit configuration of the pixel 2. The pixel 2 has, for example, a photodiode 21 as a photoelectric conversion part. The pixel 2 has a pixel configuration including a transfer transistor 22, a reset transistor 23, an amplification transistor 24, and a selection transistor 25 in addition to the photodiode 21.

Note that, here, as the four transistors of the transfer transistor 22, the reset transistor 23, the amplification transistor 24, and the selection transistor 25, for example, N-channel MOS type field effect transistors (FETs) are used. However, the combination of the conductivity types of the four transistors 22 to 25 exemplified here is a merely example, and the combination is not limited thereto.

For the pixel 2, a plurality of pixel drive lines is wired in common to each pixel 2 in the same pixel row as the pixel drive line 31 described above. The plurality of pixel drive lines is connected to output terminals of the row selection part 12 corresponding to each pixel row in units of pixel rows. The row selection part 12 appropriately outputs a transfer signal TRG, a reset signal RST, and a selection signal SEL to a plurality of pixel drive lines.

The photodiode 21 has an anode electrode connected to a low-potential-side power supply (for example, ground), photoelectrically converts received light into a photocharge (here, photoelectron) having a charge amount corresponding to the light amount of the received light, and accumulates the photocharge. A cathode electrode of the photodiode 21 is electrically connected to a gate electrode of the amplification transistor 24 via the transfer transistor 22. Here, a region where the gate electrode of the amplification transistor 24 is electrically connected is a floating diffusion (floating diffusion region/impurity diffusion region) FD. The floating diffusion FD is a charge-to-voltage conversion unit that converts charges into a voltage.

To the gate electrode of the transfer transistor 22, a transfer signal TRG for which a high level (for example, $V_{DD}$ level) becomes active is supplied from the row selection part 12. When the transfer transistor 22 becomes conductive in response to the transfer signal TRG, the photocharge photoelectrically converted in the photodiode 21 and accumulated in the photodiode 21 is transferred to the floating diffusion FD.

The reset transistor 23 is connected between the node of the high-potential-side power supply voltage $V_{DD}$ and the floating diffusion FD. To the gate electrode of the reset transistor 23, a reset signal RST at which a high level becomes active is supplied from the row selection part 12. The reset transistor 23 becomes conductive in response to the reset signal RST, and resets the floating diffusion FD by discarding the charge of the floating diffusion FD to the node of the voltage $V_{DD}$.

The gate electrode of the amplification transistor 24 is connected to the floating diffusion FD, and the drain electrode of the amplification transistor 24 is connected to the node of the high-potential-side power supply voltage $V_{DD}$. The amplification transistor 24 is an input part of a source follower that reads out a signal obtained by photoelectric conversion in the photodiode 21. That is, the source electrode of the amplification transistor 24 is connected to the vertical signal line 32 via the selection transistor 25. Then, the amplification transistor 24 and the current source I connected to one end of the vertical signal line 32 constitute a source follower that converts the voltage of the floating diffusion FD to the potential of the vertical signal line 32.

The drain electrode of the selection transistor 25 is connected to the source electrode of the amplification transistor 24, and the source electrode is connected to the vertical signal line 32. To the gate electrode of the selection transistor 25, a selection signal SEL at which a high level becomes active is supplied from the row selection part 12. The selection transistor 25 becomes conductive in response to the selection signal SEL, thereby transmitting the signal output from the amplification transistor 24 to the vertical signal line 32 with the pixel 2 selected.

Note that the selection transistor 25 can also have a circuit configuration connected between the node of the high-potential-side power supply voltage $V_{DD}$ and the drain electrode of the amplification transistor 24. Furthermore, in this example, as the pixel circuit of the pixel 2, the 4Tr configuration including the transfer transistor 22, the reset transistor 23, the amplification transistor 24, and the selection transistor 25, that is, four transistors (Tr) has been described as an example, but the configuration is not limited to this. For example, the pixel circuit of the pixel 2 can have a 3Tr configuration in which the selection transistor 25 is omitted and the amplification transistor 24 has the function of the selection transistor 25, and a 5Tr or more configuration in which the number of transistors is increased, as necessary.

[Chip Structure]

Examples of the chip (semiconductor integrated circuit) structure of the CMOS image sensor 1 having the configuration described above include a flat type chip structure and a stacked type chip structure. In any of the CMOS image sensor 1 having either the flat type chip structure or the stacked type chip structure, the pixel 2 can have a pixel structure of back-illuminated type in which, when the substrate surface on the side where the wiring layer is arranged is the front surface (front), light emitted from the back surface side that is opposite from the front surface is taken in. The flat type chip structure and the stacked type chip structure will be described below.

Flat Type Chip Structure

Figure 3:
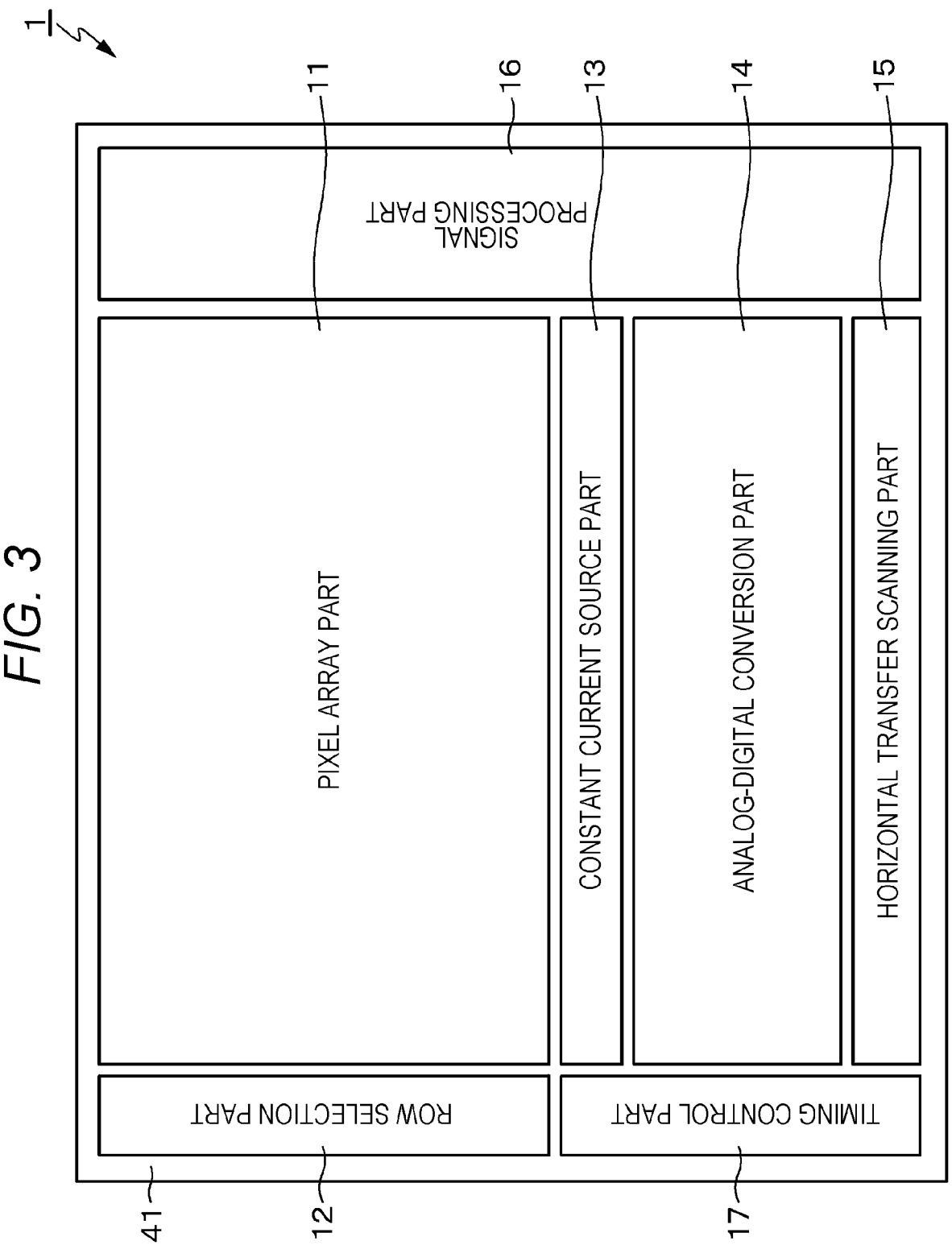
FIG. 3 is a plan view showing an outline of a flat type chip structure.

FIG. 3 is a plan view showing an outline of a flat type chip structure of the CMOS image sensor 1. As shown in FIG. 3, the flat type chip structure, that is, the flat structure has a structure in which a circuit portion around the pixel array part 11 is formed on the same semiconductor substrate 41 as the pixel array part 11 in which the pixels 2 are arranged in a matrix. Specifically, the row selection part 12, the constant current source part 13, the analog-digital conversion part 14, the horizontal transfer scanning part 15, the signal processing part 16, the timing control part 17, and the like are formed on the semiconductor substrate 41 that is same as that of the pixel array part 11.

Stacked Type Chip Structure

Figure 4:
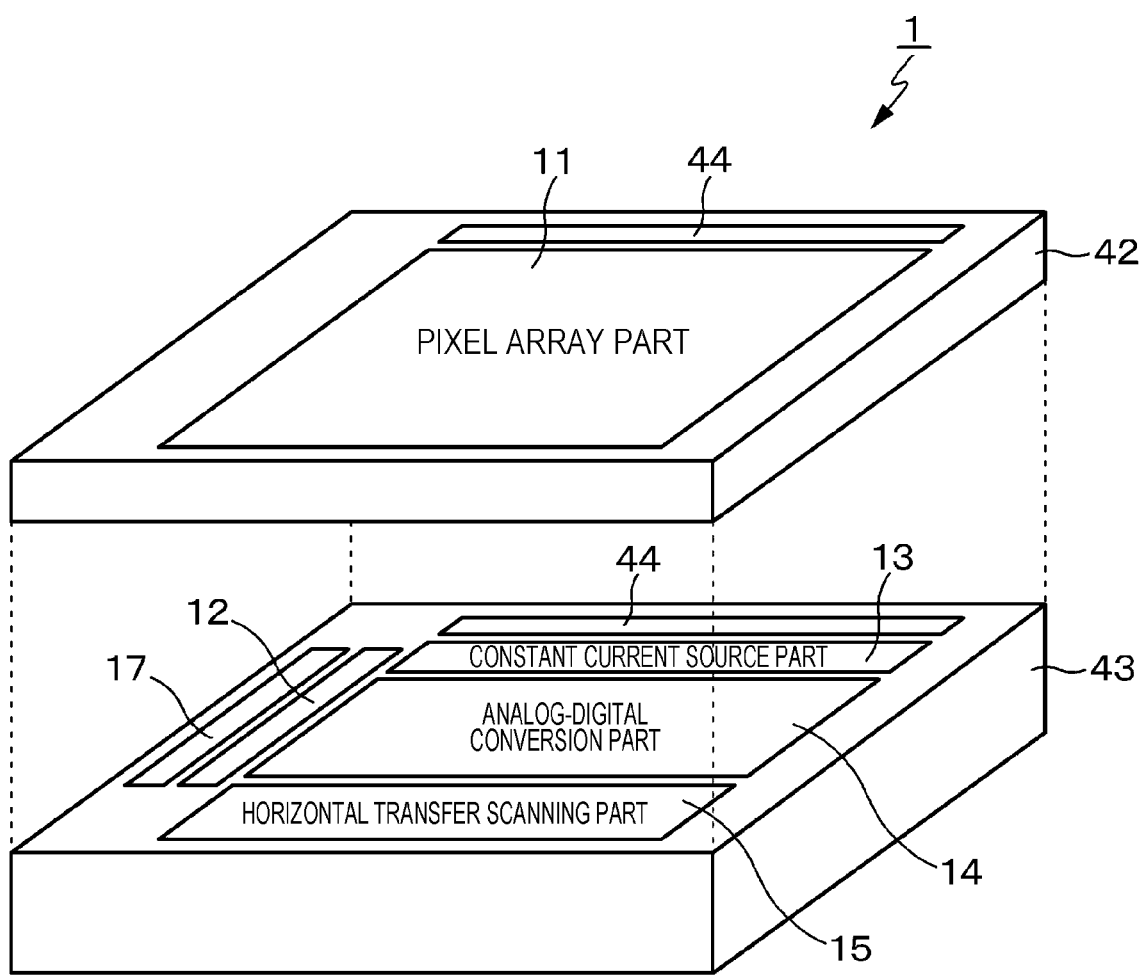
FIG. 4 is an exploded perspective view showing an outline of a stacked type chip structure.

FIG. 4 is an exploded perspective view showing an outline of a stacked type chip structure of the CMOS image sensor 1. As shown in FIG. 4, the stacked type chip structure, a so-called stacked structure, has a structure in which at least two semiconductor substrates, that is, a first semiconductor substrate 42 and a second semiconductor substrate 43, are stacked. In this stacked structure, the pixel array part 11 is formed on the first semiconductor substrate 42 that is the first layer. Furthermore, the circuit portions of the row selection part 12, the constant current source part 13, the analog-digital conversion part 14, the horizontal transfer scanning part 15, the signal processing part 16, the timing control part 17, and the like are formed on the second semiconductor substrate 43 that is the second layer. Then, the first semiconductor substrate 42 that is the first layer and the second semiconductor substrate 43 that is the second layer are electrically connected to each other through a connection part 44 such as a via or Cu—Cu connection.

According to the CMOS image sensor 1 having this stacked structure, the size (area) of the first semiconductor substrate 42 is sufficient if it can form the pixel array part 11, and thus the size (area) of the first semiconductor substrate 42 that is the first layer, and eventually, the size of the entire chip can be reduced. Moreover, since a process suitable for manufacturing the pixel 2 can be applied to the first semiconductor substrate 42 that is the first layer, and a process suitable for manufacturing a circuit portion can be applied to the second semiconductor substrate 43 that is the second layer, there is also an advantage that the process can be optimized in manufacturing the CMOS image sensor 1. In particular, when manufacturing a circuit portion, an advanced process can be applied.

Note that, here, the stacked structure of the two-layer structure formed by stacking the first semiconductor substrate 42 and the second semiconductor substrate 43 is exemplified, but the stacked structure is not limited to the two-layer structure, and a structure of three or more layers can also be adopted. Then, in a case of a stacked structure of three or more layers, the circuit portions of the row selection part 12, the constant current source part 13, the analog-digital conversion part 14, the horizontal transfer scanning part 15, the signal processing part 16, the timing control part 17, and the like can be formed dispersedly on the semiconductor substrates that are the second layer and subsequent to the second layer.

Embodiment of the Present Disclosure

In the CMOS image sensor 1 having the configuration described above, as the analog-digital converter in the column parallel analog-digital conversion part 14, a single slope type analog-digital converter, a successive approximation resistor type analog-digital converter, or the like can be exemplified. However, in the present embodiment, the successive approximation resistor type analog-digital converter, which is superior to the single-slope type analog-digital converter in terms of analog-digital conversion speed, is used as the analog-digital converter in the column parallel analog-digital conversion part 14. The successive approximation resistor type analog-digital converter may be provided in the pixel array part 11 in units of pixel columns with respect to pixel columns, or may be provided in units of a plurality of pixel columns.

Figure 5:
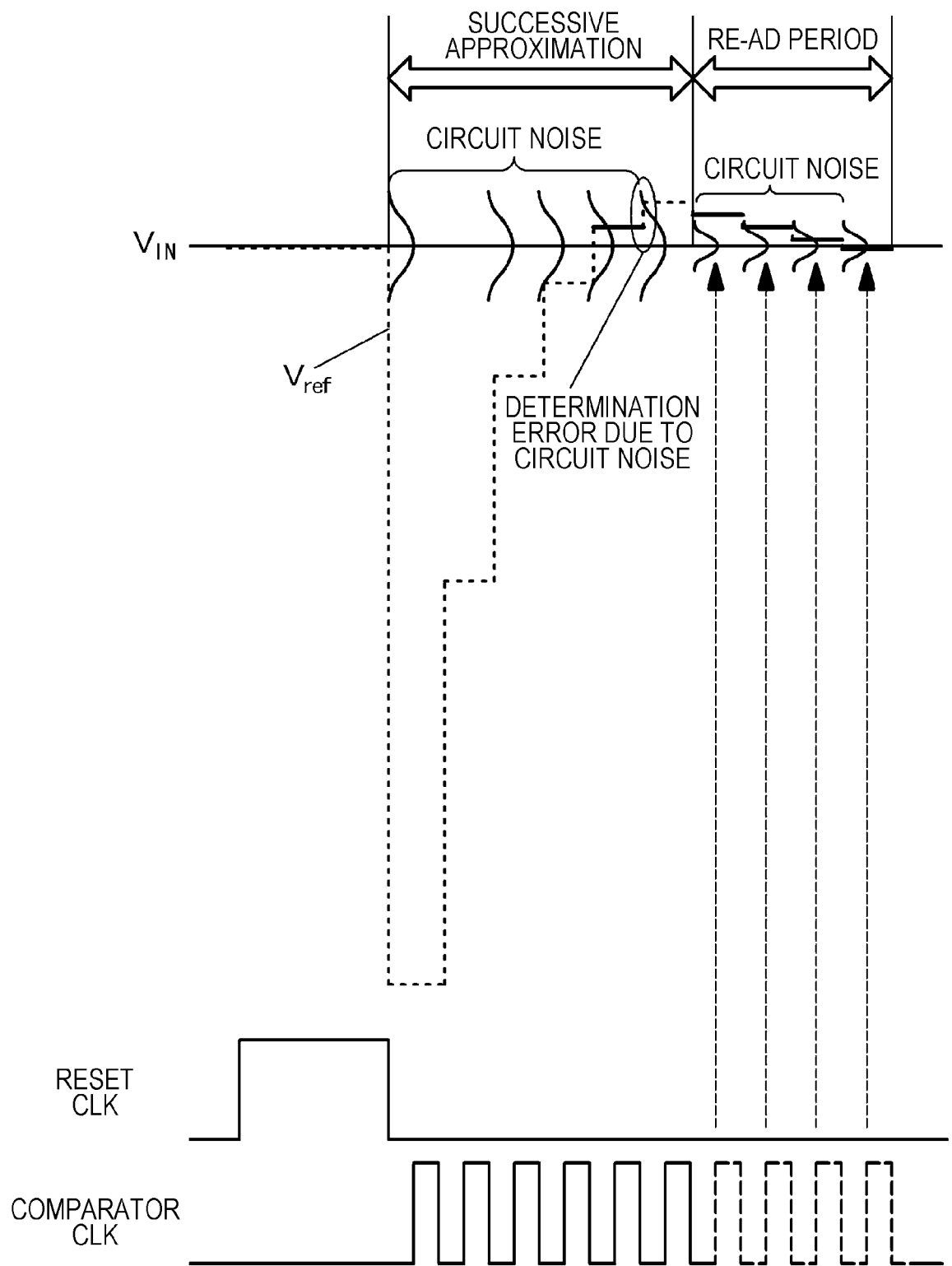
FIG. 5 is an explanatory diagram for re-analog-digital conversion.

In the successive approximation resistor type analog-digital converter, analog-digital conversion is performed according to the principle of binary search. At the time of analog-digital conversion by this successive approximation, in the comparator that compares an analog input voltage $V_{IN}$ and a comparison reference analog voltage $V_{ref}$, there is a possibility that a determination error occurs due to the influence of circuit noise. Therefore, in the successive approximation resistor type analog-digital converter having N-bit resolution, after performing analog-digital conversion by successive approximation for all bits, as shown in FIG. 5, there is provided a period in which analog-digital conversion is performed again (hereinafter, sometimes referred to as "re-AD conversion" for lower bits. Then, in the re-AD conversion, by performing the analog-digital conversion again for the lower bits, the circuit noise is reduced, and the probability of the determination error occurring in the comparator due to the influence of the circuit noise is reduced so that the value is approximated to the correct value.

The present embodiment is characterized in that, in the successive approximation resistor type analog-digital converter, the circuit noise can be further reduced and the analog-digital conversion can be performed with lower noise. Specifically, it is characterized in that a preamplifier is provided at the input stage of the successive approximation resistor type analog-digital converter, and band limitation is performed in the preamplifier during re-AD conversion. Therefore, the noise can be averaged and the circuit noise can be reduced without adversely affecting the characteristics, and therefore, it is possible to further reduce the probability that a determination error occurs in the comparator due to the influence of the circuit noise. As a result, the digital value after analog-digital conversion can be brought closer to the correct value.

Furthermore, in the successive approximation resistor type analog-digital converter, a capacitance digital-analog converter (DAC) that uses the principle of charge redistribution is used to generate the analog voltage $V_{ref}$ that is the comparison reference of the analog input voltage $V_{IN}$. In this capacitance DAC, one of the capacitance elements in the capacitance array part used in the normal successive approximation period for all bits includes multiple capacitance elements, and re-AD conversion is performed by switching the value of the reference voltage to be supplied again according to the determination result of the comparator.

By thus feeding back the determination result of the comparator to the capacitance DAC, it is possible to perform the re-AD conversion with redundancy. Then, one of the capacitance elements used in the normal successive approximation period, specifically, the capacitance element of the least significant bit is configured by a plurality of capacitance elements, and re-AD conversion is performed using the plurality of capacitance elements, so that it is possible to perform re-AD conversion without adding a capacitance element, in other words, without increasing the circuit scale.

That is, since there is no increase in the number of capacitance elements that form the capacitance DAC, it is possible to realize a low noise successive approximation resistor type analog-digital converter that can perform re-AD conversion in a small area. This is especially useful in a case where, in the CMOS image sensor 1 in which an analog-digital converter is mounted for each pixel column, for example, the pixel pitch becomes narrower as the number of pixels increases and the arrangement space of the analog-digital converter is restricted. Note that a settling error in which the signal cannot respond at high speed due to the band limitation can be absorbed by the re-AD conversion with redundancy, so that the characteristic does not deteriorate.

Specific examples of the present embodiment for reducing the circuit noise and enabling the analog-digital conversion with lower noise in the successive approximation resistor type analog-digital converter will be described below.

First Embodiment

Figure 6:
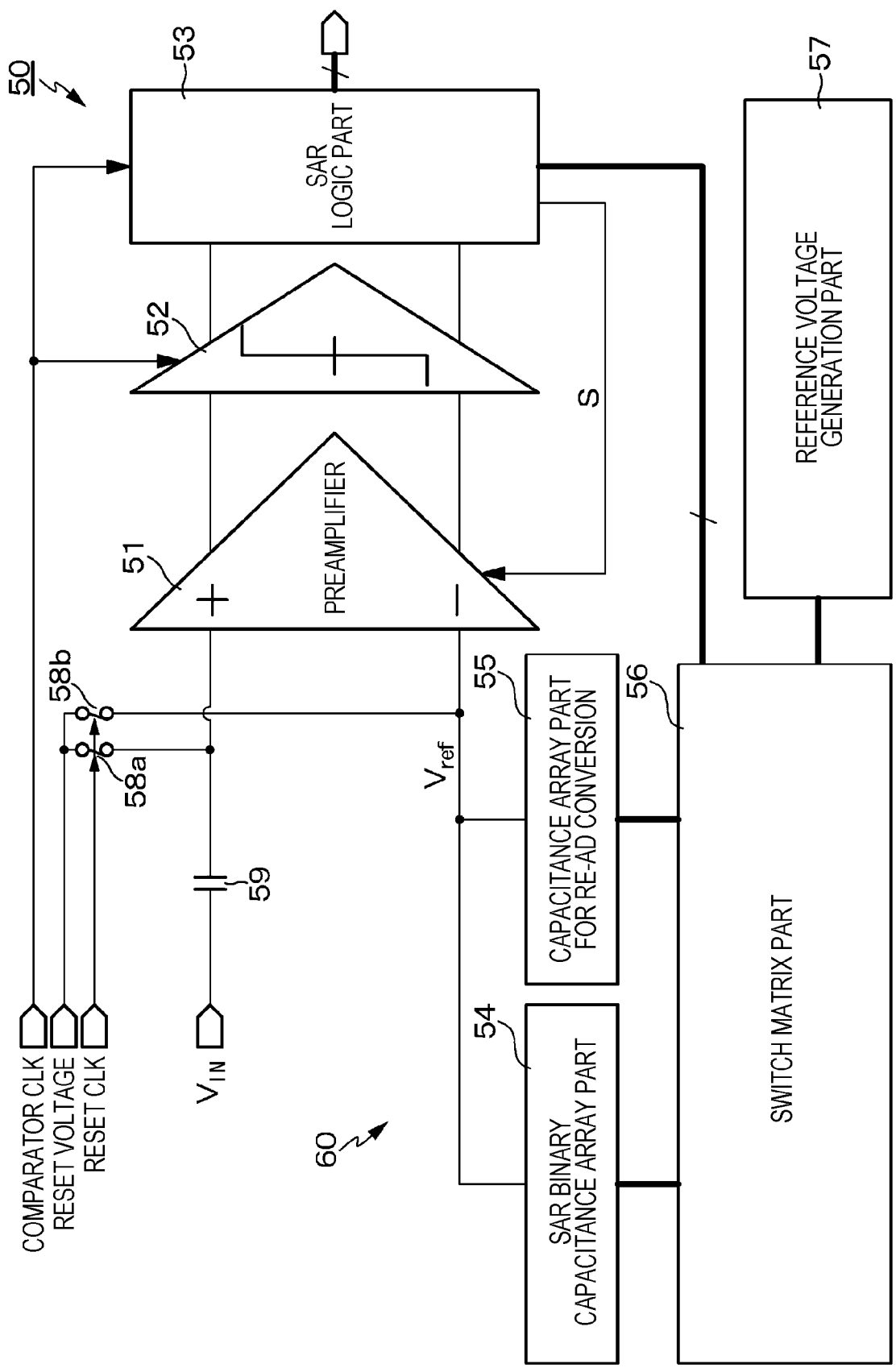
FIG. 6 is a block diagram showing a configuration of a successive approximation resistor type analog-digital converter according to a first embodiment.

FIG. 6 shows a configuration of a successive approximation resistor type analog-digital converter according to a first embodiment. As shown in FIG. 6, the successive approximation resistor type analog-digital converter 50 according to the first embodiment includes a preamplifier 51, a comparator 52, an SAR logic part 53, an SAR binary capacitance array part 54, a capacitance array part for re-AD conversion 55, a switch matrix part 56, a reference voltage generation part 57, and reset switches 58a and 58b.

In FIG. 1, the analog pixel signal output from each pixel 2 of the pixel array part 11 through the vertical signal lines $32_1$ to $32_n$ is input to the successive approximation resistor type analog-digital converter 50 as an analog input voltage $V_{IN}$. Then, as CDS processing, the amount of noise at reset output from each pixel 2 in the selected row is sampled in the capacitance element 59, and the reset level analog-digital conversion result and the signal level analog-digital conversion result are subtracted so that it is possible to cancel the noise amount at the time of reset.

The preamplifier 51 sets the analog input voltage $V_{IN}$ supplied through the capacitance element 59 as a non-inverting (+) input and the comparison reference analog voltage $V_{ref}$ as an inverting (−) input. The comparison reference analog voltage $V_{ref}$ is generated by converting a digital value after analog-digital conversion into an analog value, as described later. The preamplifier 51 has a function of limiting the band (band limiting function). Details of the band limiting function of the preamplifier 51 will be described later.

The comparator 52 compares the analog input voltage $V_{IN}$ supplied through the preamplifier 51 with the comparison reference analog voltage $V_{ref}$ in synchronization with a comparator clock (CLK), and supplies the comparison result to the SAR logic part 53. For example, the comparator 52 supplies the comparison result to the SAR logic part 53 as a differential output.

The SAR logic part 53 is an N-bit successive approximation resistor, stores the comparison result of the comparator 52 for each bit in synchronization with the comparator clock, and outputs the result as a digital value after analog-digital conversion. Then, the SAR logic part 53 supplies the N-bit digital value to the switch matrix part 56 and also supplies a control signal S for band limitation to the preamplifier 51.

The SAR binary capacitance array part 54 constitutes the capacitance array part for re-AD conversion 55, and the switch matrix part 56 constitute an N-bit capacitance digital-analog converter (DAC) 60 that employs the principle of charge redistribution. Then, in the capacitance DAC 60, using the reference voltage generated by the reference voltage generation part 57, processing of converting the N-bit digital value output from the SAR logic part 53 into an analog value, that is, the analog value $V_{ref}$ used as the comparison reference by the comparator 52 is performed.

The reference voltage generation part 57 generates a reference voltage used when converting a digital value into an analog value in the capacitance DAC 60. More specifically, in the successive approximation resistor type analog-digital converter 50 according to the first embodiment, since the capacitance array part for re-AD conversion 55 is provided, the reference voltage generation part 57 has a configuration of generating a multi-reference voltage used also in the capacitance array part for re-AD conversion 55. The specific configuration of the reference voltage generation part 57 will be described later.

Each of the reset switches 58a and 58b has one end connected to the non-inverting (+) input terminal and the inverting (−) input terminal of the preamplifier 51, and the other end is applied with a reset voltage. Then, the reset switches 58a and 58b are turned on (closed) in response to the reset clock (CLK), thereby resetting the potentials of the non-inverting input terminal and the inverting input terminal of the preamplifier 51 to the reset voltage, and performs initialization.

Figure 7:
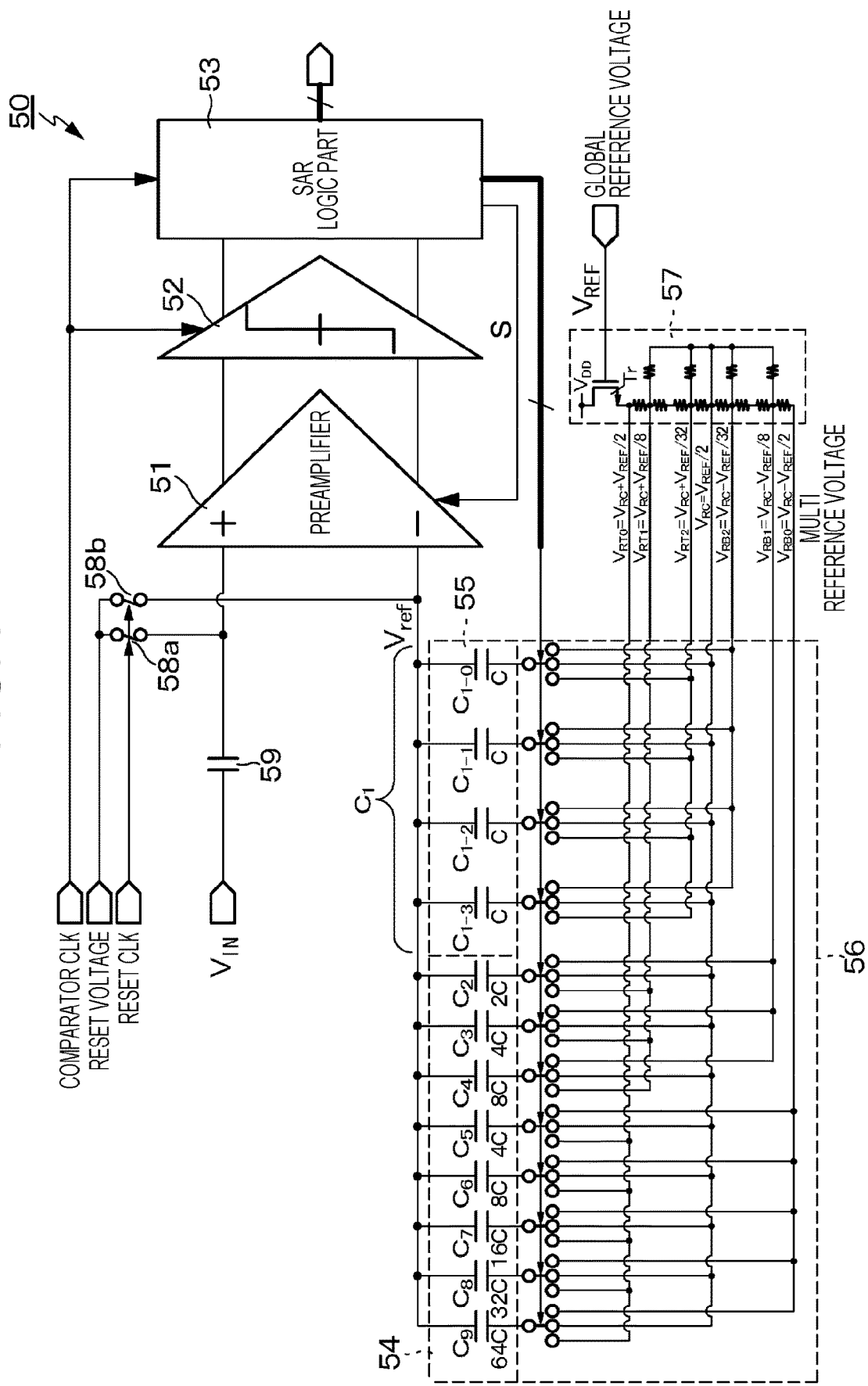
FIG. 7 is a circuit diagram showing a specific circuit configuration of an SAR binary capacitance array part, a capacitance array part for re-AD conversion, a switch matrix part, and a reference voltage generation part in the successive approximation resistor type analog-digital converter according to the first embodiment.

FIG. 7 shows specific circuit configurations of the SAR binary capacitance array part 54, the capacitance array part for re-AD conversion 55, the switch matrix part 56, and the reference voltage generation part 57 in the successive approximation resistor type analog-digital converter 50 according to the first embodiment.

The SAR binary capacitance array part 54 includes capacitance elements $C_2$ to $C_9$. Each capacitance value of the capacitance elements $C_2$ to $C_9$ has a binary weighted value weighted to a power of two times the unit capacitance value C. That is, the capacitance values of the capacitance elements $C_2$ to $C_9$ are set to 2C to 64C.

The capacitance array part for re-AD conversion 55 includes capacitance elements $C_{1-0}$ to $C_{1-3}$. Each capacitance value of the capacitance elements $C_{1-0}$ to $C_{1-3}$ is set to the unit capacitance value C. However, the capacitance value is not limited to the unit capacitance value C, and any capacitance value may be used as long as the total value is the capacitance element $C_1$. The capacitance array part for re-AD conversion 55 is used as the capacitance element $C_1$ of the least significant bit of the SAR binary capacitance array part 54 during analog-digital conversion by normal successive approximation for all bits. That is, the capacitance array part for re-AD conversion 55 has a configuration in which the capacitance element $C_1$ of the least significant bit used in the normal successive approximation period is configured by a plurality of capacitance elements $C_{1-0}$ to $C_{1-3}$ and used for re-AD conversion.

As described above, the capacitance array part including the SAR binary capacitance array part 54 and the capacitance array part for re-AD conversion 55 includes capacitance elements of the bit depth of the digital value after analog-digital conversion (that is, the output bit depth), specifically, the capacitance elements $C_2$ to $C_9$ and the capacitance elements $C_{1-0}$ to $C_{1-3}$.

The switch matrix part 56 includes a group of switches respectively connected to the capacitance elements $C_2$ to $C_9$ of the SAR binary capacitance array part 54, and a group of switches respectively connected to the capacitance elements $C_{1-0}$ to $C_{1-3}$ of the capacitance array part for re-AD conversion 55. Then, each switch group corresponding to the SAR binary capacitance array part 54 includes three switches. That is, three switches are connected to each of the capacitance elements $C_2$ to $C_9$ of the SAR binary capacitance array part 54. Furthermore, each switch group corresponding to the capacitance array part for re-AD conversion 55 also includes three switches. That is, three switches are connected to each of the capacitance elements $C_{1-0}$ to $C_{1-3}$ of the capacitance array part for re-AD conversion 55.

The reference voltage generation part 57 includes: a transistor Tr connected to a power supply $V_{DD}$; a plurality of resistance elements connected in series with the transistor; and a resistance element group including resistance elements appropriately connected to a common connection node of these resistance elements, and generates a multi-reference voltage on the basis of a global reference voltage $V_{REF}$.

Specifically, a center reference voltage $V_{RC}$ ($=V_{REF}/2$) is derived from an intermediate node of the series-connected group of resistance elements. A top reference voltage $V_{RT0}$ ($=V_{RC}+V_{REF}/2$) and a reference voltage $V_{RT1}$ ($=V_{RC}+V_{REF}/8$) are derived from each node between the node on the transistor Tr side and the intermediate node of the series connected group of resistance elements, and moreover, a reference voltage $V_{RT2}$ ($=V_{RC}+V_{REF}/32$) is derived. Furthermore, a bottom reference voltage $V_{RB0}$ ($=V_{RC}-V_{REF}/2$) is derived from each node between the node at the extreme end of the series-connected resistance element group and the intermediate node, and moreover, a reference voltage $V_{RB1}$ ($=V_{RC}-V_{REF}/8$) and a reference voltage $V_{RB2}$ ($=V_{RC}-V_{REF}/32$) are derived.

The multi-reference voltage generated by the reference voltage generation part 57 is supplied to each switch group corresponding to each bit of the switch matrix part 56. Specifically, the center reference voltage $V_{RC}$ is commonly supplied to the middle switch of the three switches in each switch group corresponding to the SAR binary capacitance array part 54 and the capacitance array part for re-AD conversion 55.

The top reference voltage $V_{RT0}$ is commonly supplied to the switches on one side of each of the three switches corresponding to the capacitance elements $C_5$ to $C_9$ of the SAR binary capacitance array part 54. The reference voltage $V_{RT1}$ is commonly supplied to the switches on one side of each of the three switches corresponding to the capacitance elements $C_2$ to $C_4$ of the SAR binary capacitance array part 54. The reference voltage $V_{RT2}$ is commonly supplied to the switches on one side of each of the three switches corresponding to the capacitance elements $C_{1-0}$ to $C_{1-3}$ of the capacitance array part for re-AD conversion 55.

The bottom reference voltage $V_{RB0}$ is commonly supplied to the switches on the other side of each of the three switches corresponding to the capacitance elements $C_5$ to $C_9$ of the SAR binary capacitance array part 54. The reference voltage $V_{RB1}$ is commonly supplied to the switches on the other side of each of the three switches corresponding to the capacitance elements $C_2$ to $C_4$ of the SAR binary capacitance array part 54. The reference voltage $V_{RB2}$ is commonly supplied to the switches on the other side of each of the three switches corresponding to the capacitance elements $C_{1-0}$ to $C_{1-3}$ of the capacitance array part for re-AD conversion 55.

In the switch matrix part 56, the three switches of each switch group provided corresponding to each capacitance element of the SAR binary capacitance array part 54 and the capacitance array part for re-AD conversion 55 perform operation as below, in the analog-digital conversion period by the normal successive approximation for all bits and the subsequent re-AD conversion period.

That is, at the time of normal successive approximation, the three switches of each switch group corresponding to the capacitance element $C_5$ to the capacitance element $C_9$ perform switching operation among the top reference voltage $V_{RT0}$ ($=V_{RC}+V_{REF}/2$)-the center reference voltage $V_{RC}$ ($=V_{REF}/2$)-the bottom reference voltage $V_{RB0}$ ($=V_{RC}-V_{REF}/2$). The three switches of each switch group corresponding to the capacitance element $C_2$ to the capacitance element $C_4$ perform switching operation among the reference voltage $V_{RT1}$ ($=V_{RC}+V_{REF}/8$)-the center reference voltage $V_{RC}$-the reference voltage $V_{RB1}$ ($=V_{RC}-V_{REF}/8$). Each of the three switches corresponding to the capacitance elements $C_{1-0}$ to $C_{1-3}$ simultaneously drives the capacitance elements $C_{1-0}$ to $C_{1-3}$ to form a capacitance element $C_1$ having a capacitance value of 4C.

At the time of re-AD conversion, each of the three switches corresponding to the plurality of capacitance elements $C_{1-0}$ to $C_{1-3}$ corresponding to the capacitance element $C_1$ of the least significant bit used in the normal successive approximation period performs switching operation among the reference voltage $V_{RT2}$-the center reference voltage $V_{RC}$-the reference voltage $V_{RB2}$ sequentially for each of the capacitance element $C_{1-0}$ to the capacitance element $C_{1-3}$.

By performing the re-AD conversion, noise can be averaged and circuit noise can be reduced. As a result, the probability that a determination error occurs in the comparator 52 due to the influence of circuit noise can be reduced, and the digital value after analog-digital conversion can be brought close to the correct value.

As described above, the successive approximation resistor type analog-digital converter 50 according to the first embodiment includes the capacitance array part for re-AD conversion 55 for performing re-AD conversion for lower bits after analog-digital conversion by normal successive approximation for all bits. Then, the successive approximation resistor type analog-digital converter 50 according to the first embodiment has a configuration in which the capacitance element $C_1$ used in the normal successive comparison period includes a plurality of capacitance elements $C_{1-0}$ to $C_{1-3}$, and used in the re-AD conversion, and the reference voltage is supplied through a dedicated switch group for driving the capacitance element array. Accordingly, since it is not necessary to add a new capacitance element for re-AD conversion, it is possible to realize the low noise successive approximation resistor type analog-digital converter 50 that can perform re-AD conversion in a small area.

(Regarding Band Limiting Function)

Next, the preamplifier 51 having a band limiting function will be described. The preamplifier 51 performs band limitation in response to the control signal S supplied from the SAR logic part 53 under the control of the SAR logic part 53. The band limitation of the preamplifier 51 can be performed at least during the re-AD conversion period in FIG. 5, or can be performed only during the re-AD conversion period.

The band limitation can be realized also in the comparator 52 at the subsequent stage, but if the band limitation is performed in the comparator 52, the analog-digital conversion speed becomes low. Accordingly, from the viewpoint of analog-digital conversion speed, it is important to arrange the preamplifier 51 before the comparator 52, and perform the band limitation in the preamplifier 51, and since the noise can be averaged by the band limitation, the circuit noise can be reduced and the noise can be reduced.

Specific examples of the band limiting function in the preamplifier 51 will be described below as first to fourth examples.

First Example

Figure 8A:
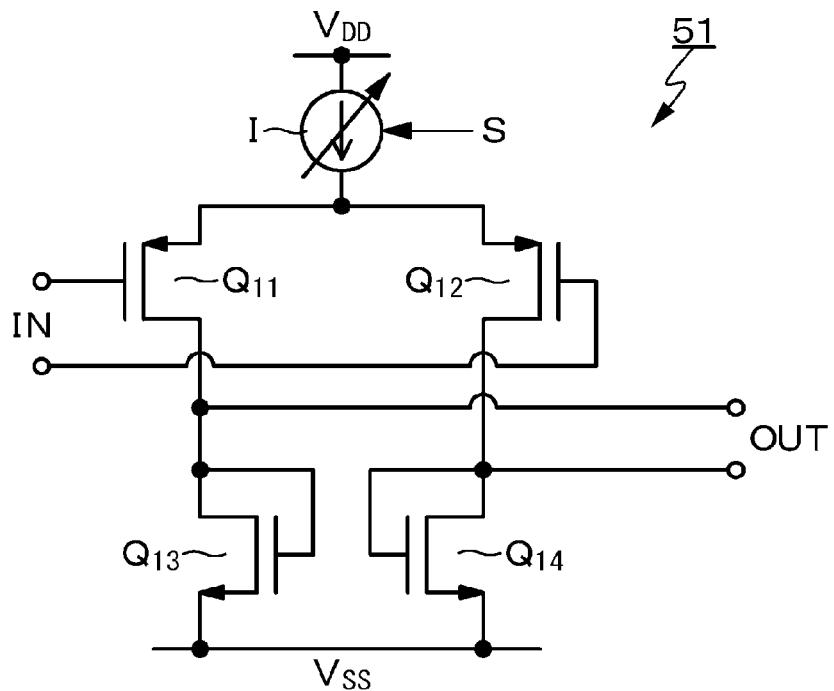
FIG. 8A is a circuit diagram showing a first example of band limiting function in the preamplifier.

FIG. 8A shows a first example of the band limiting function in the preamplifier 51. The preamplifier 51 has, for example, a configuration including differential transistors $Q_{11}$ and $Q_{12}$, load transistors $Q_{13}$ and $Q_{14}$, and a variable current source I. The differential transistors $Q_{11}$ and $Q_{12}$ include, for example, P-channel field effect transistors, and operate with their source electrodes commonly connected.

The load transistors $Q_{13}$ and $Q_{14}$ include, for example, N-channel field effect transistors and have a diode configuration in which a gate electrode and a drain electrode are commonly connected, and connected between each drain electrode of the differential transistors $Q_{11}$ and $Q_{12}$ and a low potential side power supply $V_{SS}$. The variable current source I is connected between the source common connection node of the differential transistors $Q_{11}$ and $Q_{12}$ and the high potential side power supply $V_{DD}$.

The preamplifier 51 configured as described above has a configuration in which the current of the variable current source I can be adjusted according to the control signal S supplied from the SAR logic part 53. Then, at the time of re-AD conversion, the variable current source I adjusts the current of the preamplifier 51 and the load resistance (1/gm) can be changed to narrow the band, so that the noise of the preamplifier 51 can be reduced. Note that it is also possible to perform band limitation by controlling the current source bias or the number of current sources to be driven.

Second Example

Figure 8B:
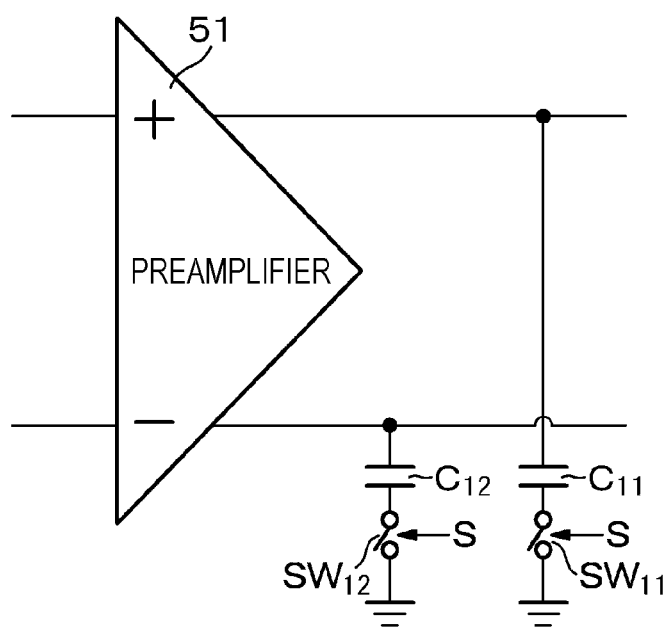
FIG. 8B is a circuit diagram showing a second example of the band limiting function in the preamplifier.

FIG. 8B shows a second example of the band limiting function in the preamplifier 51. The second example has a configuration in which the capacitance element $C_{11}$ and the switch $SW_{11}$, and the capacitance element $C_{12}$ and the switch $SW_{12}$ are connected in series between the output node of the differential output of the preamplifier 51 and the ground.

In the preamplifier 51 having the configuration described above, the switch $SW_{11}$ and the switch $SW_{12}$ are turned on (closed) according to the control signal S supplied from the SAR logic part 53, thereby changing the ground capacitance of the output of the preamplifier 51. Then, the band can be narrowed by changing the ground capacitance of the output of the preamplifier 51 at the time of the re-AD conversion, so that the noise of the preamplifier 51 can be reduced.

Third Example

Figure 9A:
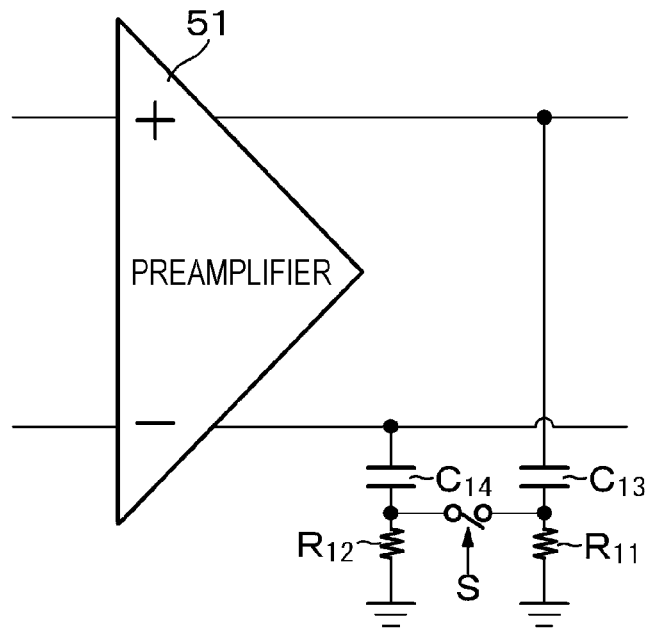
FIG. 9A is a circuit diagram showing a third example of the band limiting function in the preamplifier.

FIG. 9A shows a third example of the band limiting function in the preamplifier 51. The third example has a configuration in which the capacitance element $C_{13}$ and the resistance element $R_{11}$, and the capacitance element $C_{14}$ and the resistance element $R_{12}$ are connected in series between the output node of the differential output of the preamplifier 51 and the ground, and the switch $SW_{13}$ is connected between the ends of the capacitance element $C_{13}$ and the capacitance element $C_{14}$ on the resistance element side.

In the preamplifier 51 having the configuration described above, the switch $SW_{13}$ is turned on according to the control signal S supplied from the SAR logic part 53, so that a capacitance is added to between the differential outputs of the preamplifier 51. Then, the band can be narrowed by adding capacitance to between the differential outputs of the preamplifier 51 at the time of the re-AD conversion, so that the noise of the preamplifier 51 can be reduced.

Fourth Example

Figure 9B:
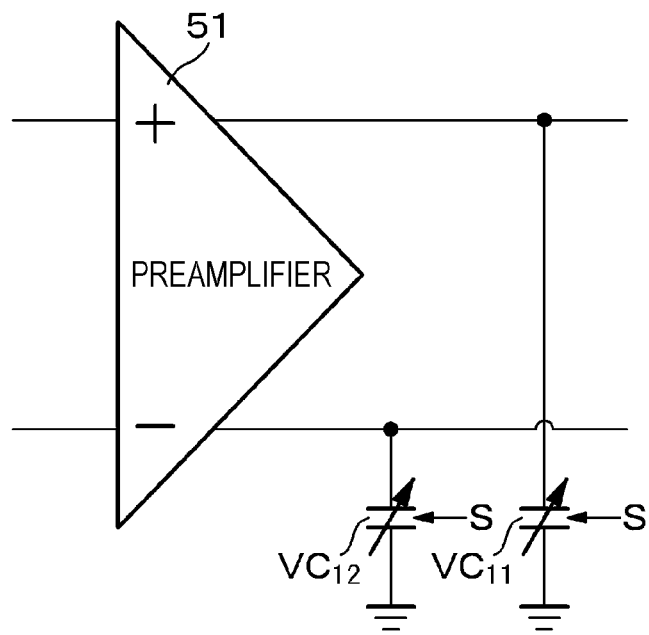
FIG. 9B is a circuit diagram showing a fourth example of the band limiting function in the preamplifier.

FIG. 9B shows a fourth example of the band limiting function in the preamplifier 51. The fourth example has a configuration in which variable capacitance diodes (varactors/varicaps) $VC_{11}$ and $VC_{12}$ are connected between the output node of the differential output of the preamplifier 51 and the ground.

In a case of the preamplifier 51 having the configuration described above, the control signal S supplied from the SAR logic part 53 becomes a control voltage for controlling the capacitance of the variable capacitance diodes $VC_{11}$ and $VC_{12}$. Then, since the band can be narrowed by controlling the capacitances of the variable capacitance diodes $VC_{11}$ and $VC_{12}$ at the time of the re-AD conversion, the noise of the preamplifier 51 can be reduced.

Second Embodiment

Figure 10:
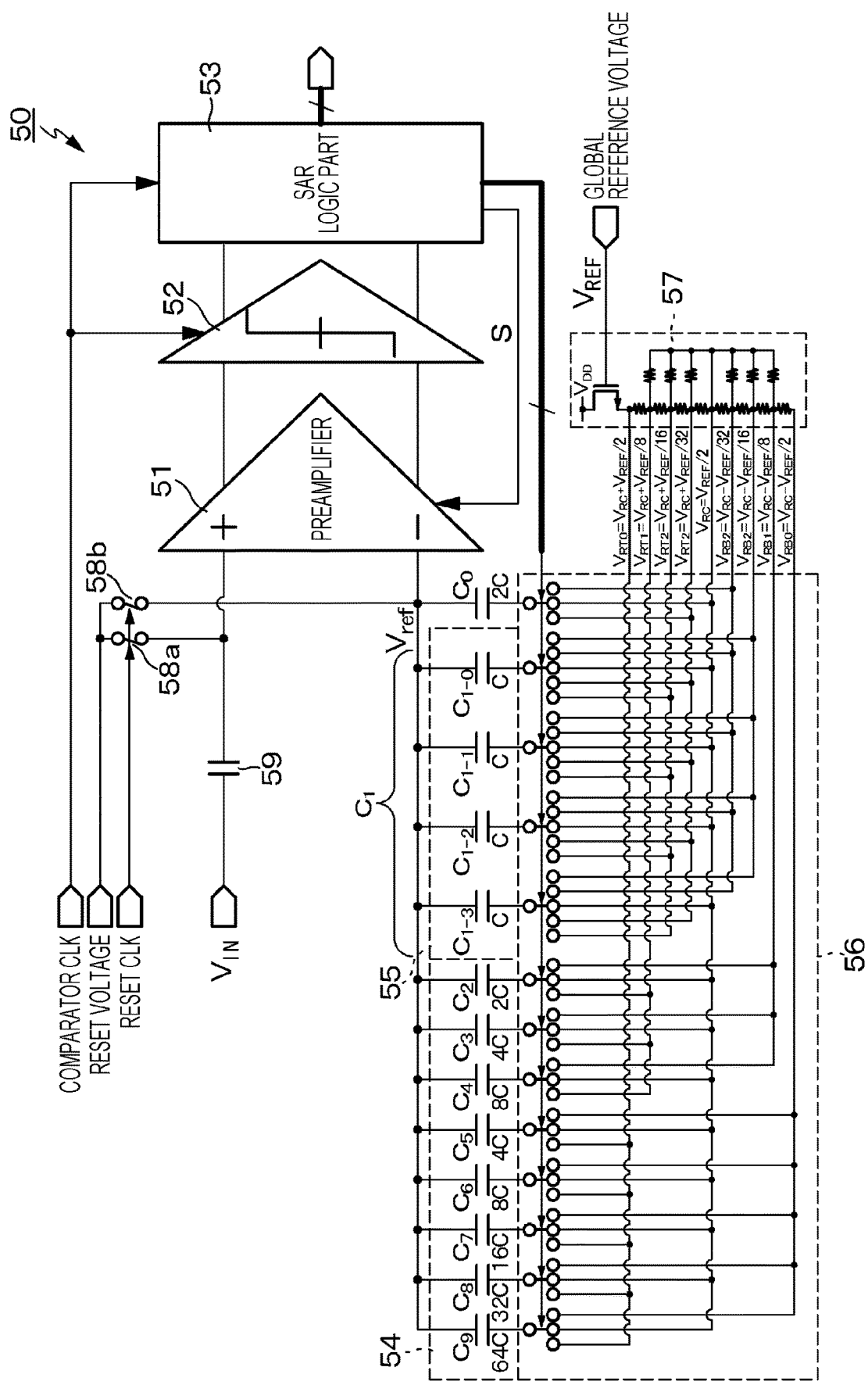
FIG. 10 is a circuit diagram showing a circuit configuration of a successive approximation resistor type analog-digital converter according to a second embodiment.

FIG. 10 shows the circuit configuration of the successive approximation resistor type analog-digital converter 50 according to a second embodiment. As shown in FIG. 10, in the switch matrix part 56, each switch group corresponding to the capacitance elements $C_{1-0}$ to $C_{1-3}$ of the capacitance array part for re-AD conversion 55 includes five switches, and this is different from the case of the first embodiment including three switches.

With the addition of two switches to each switch group corresponding to the capacitance element $C_{1-0}$ to the capacitance element $C_{1-3}$, the reference voltage generation part 57 further generates a reference voltage $V_{RT2}$ ($=V_{RC}+V_{REF}/16$) and a reference voltage $V_{RB2}$ ($=V_{RC}-V_{REF}/16$) The reference voltage $V_{RT2}$ is applied to one of the two added switches, and the reference voltage $V_{RB2}$ is applied to the other of the two added switches.

In the switch matrix part 56, the switching operation of the three switches in each switch group at the time of analog-digital conversion by normal successive approximation for all bits is the same as that in the first embodiment.

At the time of re-AD conversion, each of the five switches corresponding to the capacitance element $C_{1-0}$ to capacitance element $C_{1-3}$ performs switching operation among the reference voltage $V_{RT2}$ ($=V_{RC}+V_{REF}/16$)-the reference voltage $V_{RT2}$ ($=V_{RC}+V_{REF}/32$)-the center reference voltage $V_{RC}$-the reference voltage $V_{RB2}$ ($=V_{RC}-V_{REF}/32$)-the reference voltage $V_{RB2}$ ($=V_{RC}-V_{REF}/16$)

Therefore, two types of reference voltage $V_{RT2}$, center reference voltage $V_{RC}$, and two types of reference voltage $V_{RB2}$ are selectively applied to the capacitance elements $C_{1-0}$ to $C_{1-3}$, as at least the first reference voltage to the fourth reference voltage, so that re-AD conversion is performed for lower bits.

By performing re-AD conversion for lower bits, the circuit noise can be reduced and the probability that a determination error occurs in the comparator 52 due to the influence of the circuit noise can be reduced, so that the digital value after the analog-digital conversion can be approximated to the correct value. Furthermore, at the time of re-AD conversion, the band limitation is performed by the preamplifier 51, so that the noise can be averaged without adversely affecting the characteristics, and the noise can be reduced.

Third Embodiment

Figure 11:
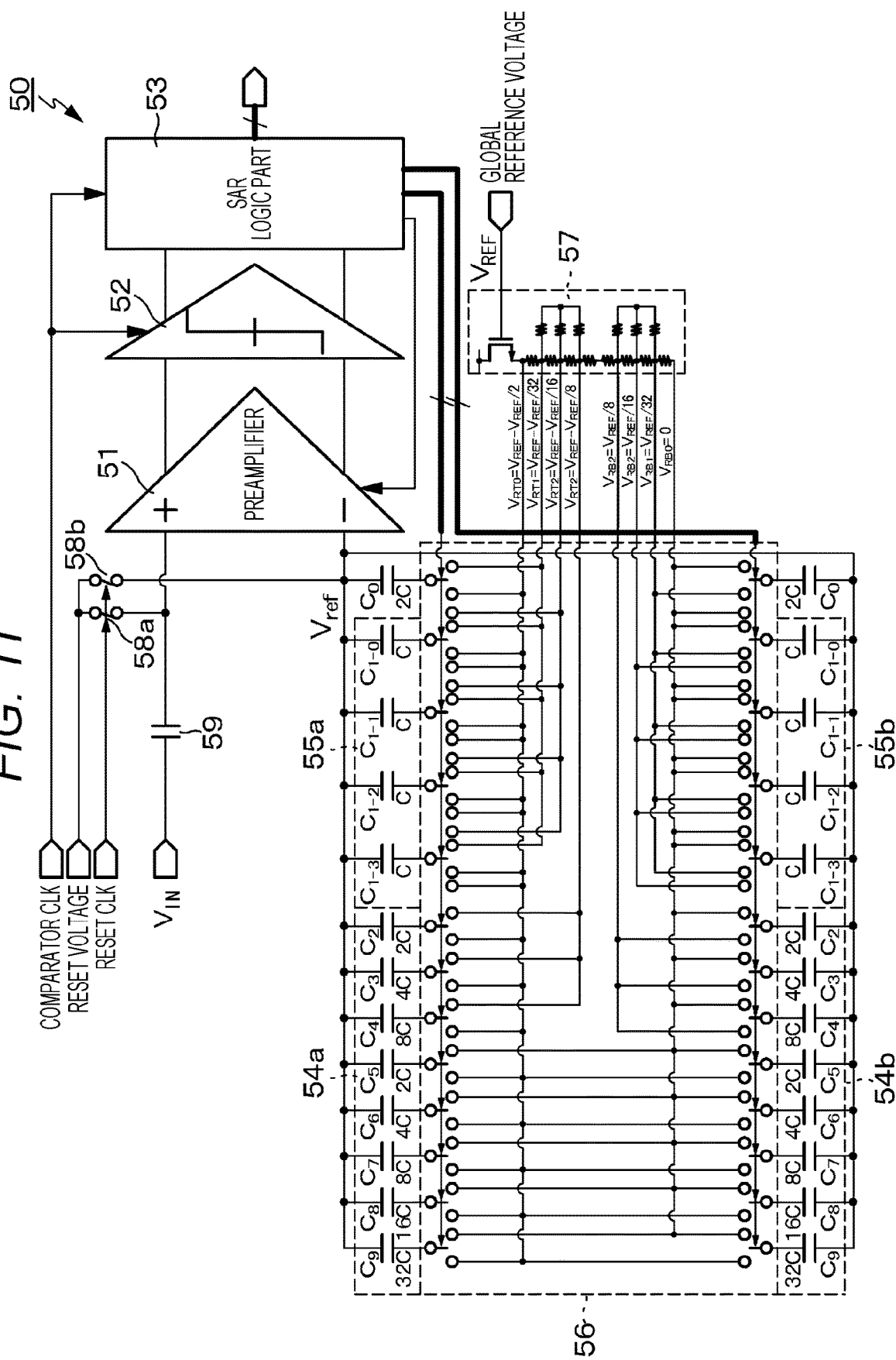
FIG. 11 is a circuit diagram showing a circuit configuration of a successive approximation resistor type analog-digital converter according to a third embodiment.

FIG. 11 shows the circuit configuration of the successive approximation resistor type analog-digital converter 50 according to a third embodiment. In the case of the third embodiment, two systems (54a, 54b/55a, 55b) of the SAR binary capacitance array part 54 and the capacitance array part for re-AD conversion 55 are provided. Then, the capacitance values of the capacitance elements $C_5$ to $C_9$ of the SAR binary capacitance array parts 54a and 54b are different from those in the first and second embodiments. Specifically, setting is made such that the capacitance value of the capacitance element $C_5$ is 2C, the capacitance value of the capacitance element $C_6$ is 4C, the capacitance value of the capacitance element $C_7$ is 8C, the capacitance value of the capacitance element $C_8$ is 16C, and the capacitance value of the capacitance element $C_9$ is 32C.

Then, in the switch matrix part 56, each switch group corresponding to the capacitance element $C_2$ to the capacitance element $C_9$ of the SAR binary capacitance array parts 54a and 54b includes two switches. Furthermore, each switch group corresponding to the capacitance element $C_{1-0}$ to the capacitance element $C_{1-3}$ of the capacitance array parts for re-AD conversion 55a and 55b includes four switches, that is, two more switches than that in the SAR binary capacitance array parts 54a and 54b side.

Corresponding to each switch of the switch matrix part 56, the reference voltage generation part 57 generates a top reference voltage $V_{RT0}$ ($=V_{REF}-V_{REF}/2$), a reference voltage $V_{RT1}$ ($=V_{REF}-V_{REF}/32$), a reference voltage $V_{RT2}$ ($=V_{REF}-V_{REF}/16$), and a reference voltage $V_{RT2}$ ($=V_{REF}-V_{REF}/8$), as multi-reference voltages.

The top reference voltage $V_{RT0}$ is supplied to one of the two switches corresponding to the capacitance elements $C_2$ to $C_9$ of the SAR binary capacitance array parts 54a and 54b, and is supplied to two of the four switches corresponding to the capacitance element $C_{1-0}$ to the capacitance element $C_{1-3}$ of the capacitance array part for re-AD conversion 55a. The reference voltage $V_{RT1}$ ($=V_{REF}-V_{REF}/32$) and the reference voltage $V_{RT2}$ ($=V_{REF}-V_{REF}/16$) are supplied to the remaining two of the four switches corresponding to the capacitance element $C_{1-0}$ to the capacitance element $C_{1-3}$ of the capacitance array part for re-AD conversion 55a. The reference voltage $V_{RT2}$ ($=V_{REF}-V_{REF}/8$) is supplied to the other of the two switches corresponding to the capacitance elements $C_2$ to the capacitance element $C_4$ of the SAR binary capacitance array part 54a.

The reference voltage generation part 57 further generates a bottom reference voltage $V_{RB0}$ ($=0$), a reference voltage $V_{RB1}$ ($=V_{REF}/32$), a reference voltage $V_{RB2}$ ($=V_{REF}/16$), and a reference voltage $V_{RB2}$ ($=V_{REF}/8$) as multi-reference voltages.

The bottom reference voltage $V_{RB0}$ is supplied to the other of the two switches corresponding to the capacitance elements $C_2$ to $C_9$ of the SAR binary capacitance array parts 54a and 54b, and the is supplied to two of the four switches corresponding to the capacitance element $C_{1-0}$ to the capacitance element $C_{1-3}$ of the capacitance array part for re-AD conversion 55b. The reference voltage $V_{RB1}$ ($=V_{REF}/32$) and the reference voltage $V_{RB2}$ ($=V_{REF}/16$) are supplied to the remaining two of the four capacitance elements $C_{1-0}$ to $C_{1-3}$ of the capacitance array part for re-AD conversion 55b. The reference voltage $V_{RB2}$ ($=V_{REF}/8$) is supplied to the other of the two switches corresponding to each of the capacitance element $C_2$ to the capacitance element $C_4$ of the SAR binary capacitance array part 54b.

In the switch matrix part 56, at the time of analog-digital conversion by normal successive approximation for all bits, the two switches corresponding to the capacitance element $C_5$ to the capacitance element $C_9$ of the SAR binary capacitance array parts 54a and 54b perform switching operation between the top reference voltage $V_{RT0}$-the bottom reference voltage $V_{RB0}$. The two switches corresponding to the capacitance element $C_2$ to the capacitance element $C_4$ of the SAR binary capacitance array part 54a perform switching operation between the top reference voltage $V_{RT0}$-the reference voltage $V_{RT2}$ ($=V_{REF}-V_{REF}/8$). The two switches corresponding to the capacitance element $C_2$ to the capacitance element $C_4$ of the SAR binary capacitance array part 54b perform switching operation between the bottom reference voltage $V_{RB0}$-the reference voltage $V_{RB2}$ ($=V_{REF}/8$).

At the time of re-AD conversion, the four switches corresponding to the capacitance element $C_{1-0}$ to the capacitance element $C_{1-3}$ of the capacitance array part for re-AD conversion 55a perform switching operation among the top reference voltage $V_{RT0}$-the reference voltage $V_{RB1}$-the reference voltage $V_{RB2}$. Furthermore, the four switches corresponding to the capacitance element $C_{1-0}$ to the capacitance element $C_{1-3}$ of the capacitance array part for re-AD conversion 55b perform switching operation among the bottom reference voltage $V_{RB0}$-the reference voltage $V_{RB1}$-the reference voltage $V_{RB2}$.

By the switching operation of each switch of the switch matrix part 56 described above, also in the successive approximation resistor type analog-digital converter 50 according to the third embodiment, by performing the re-AD conversion for lower bits, circuit noise can be reduced and noise can be reduced. As a result, the probability that a determination error occurs in the comparator 52 due to the influence of circuit noise can be reduced, and the digital value after analog-digital conversion can be brought close to the correct value. Furthermore, at the time of re-AD conversion, the band limitation is performed by the preamplifier 51, so that the noise can be averaged without adversely affecting the characteristics, and the noise can be reduced.

Fourth Embodiment

Figure 12:
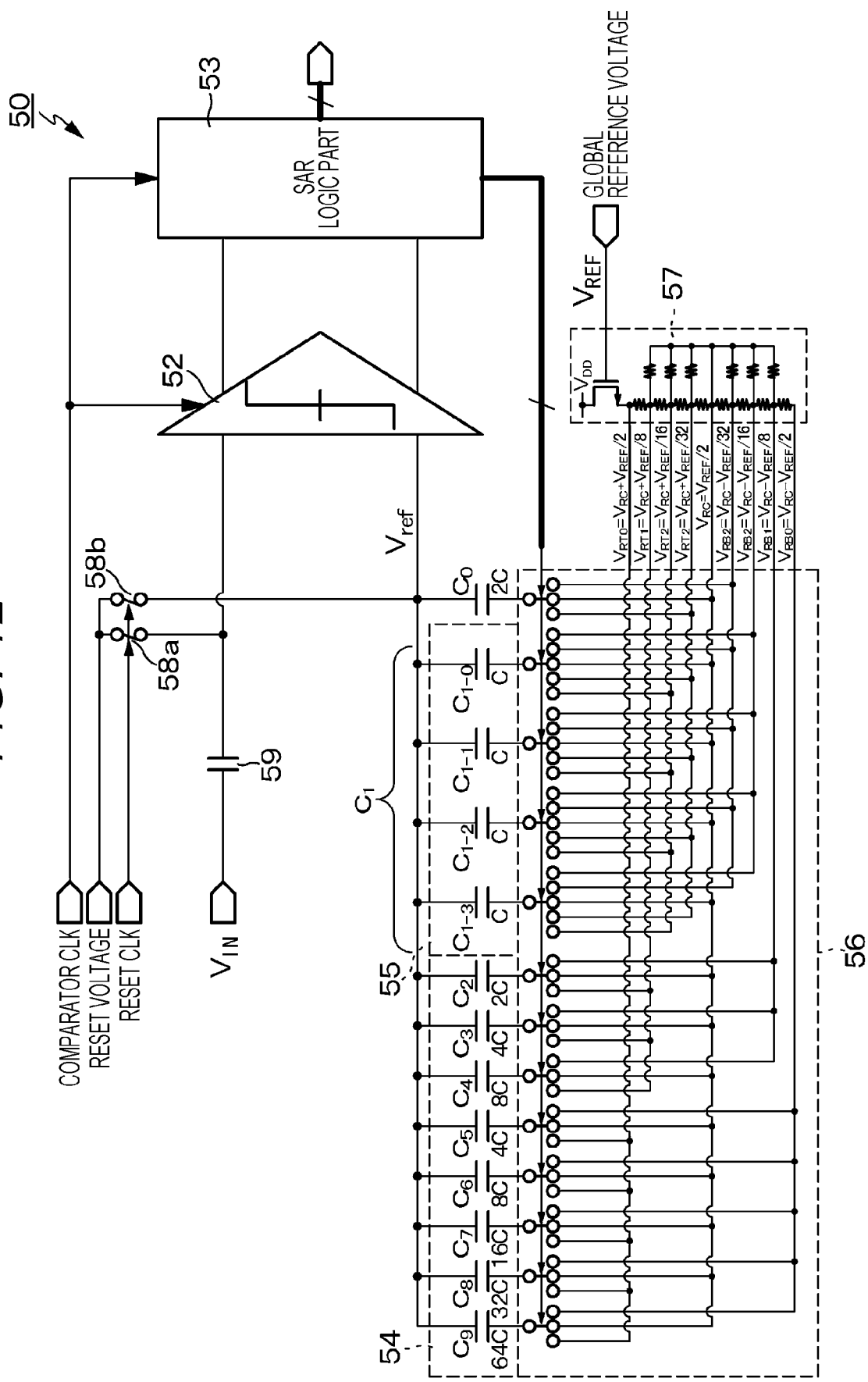
FIG. 12 is a circuit diagram showing a circuit configuration of a successive approximation resistor type analog-digital converter according to a fourth embodiment.

A fourth embodiment is a modification of the second embodiment and has a configuration without the preamplifier 51. FIG. 12 shows the circuit configuration of the successive approximation resistor type analog-digital converter 50 according to the fourth embodiment.

As shown in FIG. 12, in the successive approximation resistor type analog-digital converter 50 according to the fourth embodiment, the analog input voltage $V_{IN}$ and the comparison reference analog voltage $V_{ref}$ are directly input to the comparator 52 without providing the preamplifier 51 in the input stage.

In the successive approximation resistor type analog-digital converter 50 according to the fourth embodiment, although the preamplifier 51 does not exist, the action and effect by the band limitation cannot be obtained, the circuit noise can be reduced and the noise can be reduced by performing the re-AD conversion for lower bits, so that the digital value after the analog-digital conversion can be approximated to the correct value.

<Modification>

Although the technology of the present disclosure has been described above on the basis of the preferred embodiments, the technique of the present disclosure is not limited to the embodiments. The configuration and structure of the imaging element described in each of the above embodiments are illustrative and can be changed as appropriate. For example, the combination of the number of the switch groups of the capacitance element $C_2$ to the capacitance element $C_9$ of the SAR binary capacitance array part 54 and the switch groups of the capacitance element $C_{1-0}$ to the capacitance element $C_{1-3}$ of the capacitance array part for re-AD conversion 55 is not limited to that of the first to third embodiments. As another combination, for example, a configuration can be exemplified in which each switch group of the capacitance element $C_2$ to the capacitance element $C_9$ of the SAR binary capacitance array part 54 includes two switches, and each switch group of the capacitance element $C_{1-0}$ to the capacitance element of $C_{1-3}$ of the capacitance array part for re-AD conversion 55 includes three switches.

Furthermore, in the embodiment described above, the case where the successive approximation resistor type analog-digital converter to which the technology according to the present disclosure is applied is used as the analog-digital converter of the analog-digital conversion part of the imaging element has been described as an example. However, the application example is not limitation. That is, the successive approximation resistor type analog-digital converter to which the technology according to the present disclosure is applied may be used as the analog-digital converter in various circuits and devices including an analog-digital converter.

Furthermore, in the embodiment described above, the case where the technology according to the present disclosure is applied to the CMOS image sensor including pixels 2 in a matrix has been described as an example, but the technology according to the present disclosure is not limited to the application to the CMOS image sensor. That is, the technology according to the present disclosure is an X-Y address system in which pixels 2 are two-dimensionally arranged in a matrix, and is applicable to all imaging elements equipped with a successive approximation resistor type analog-digital converter.

Furthermore, the technology according to the present disclosure is not limited to application to an imaging element that detects the distribution of the incident light amount of visible light and captures it as an image, but is applicable to all imaging element that captures the distribution of the incident amount of infrared rays, X-rays, particles, and the like as an image.

Application Example

Figure 13:
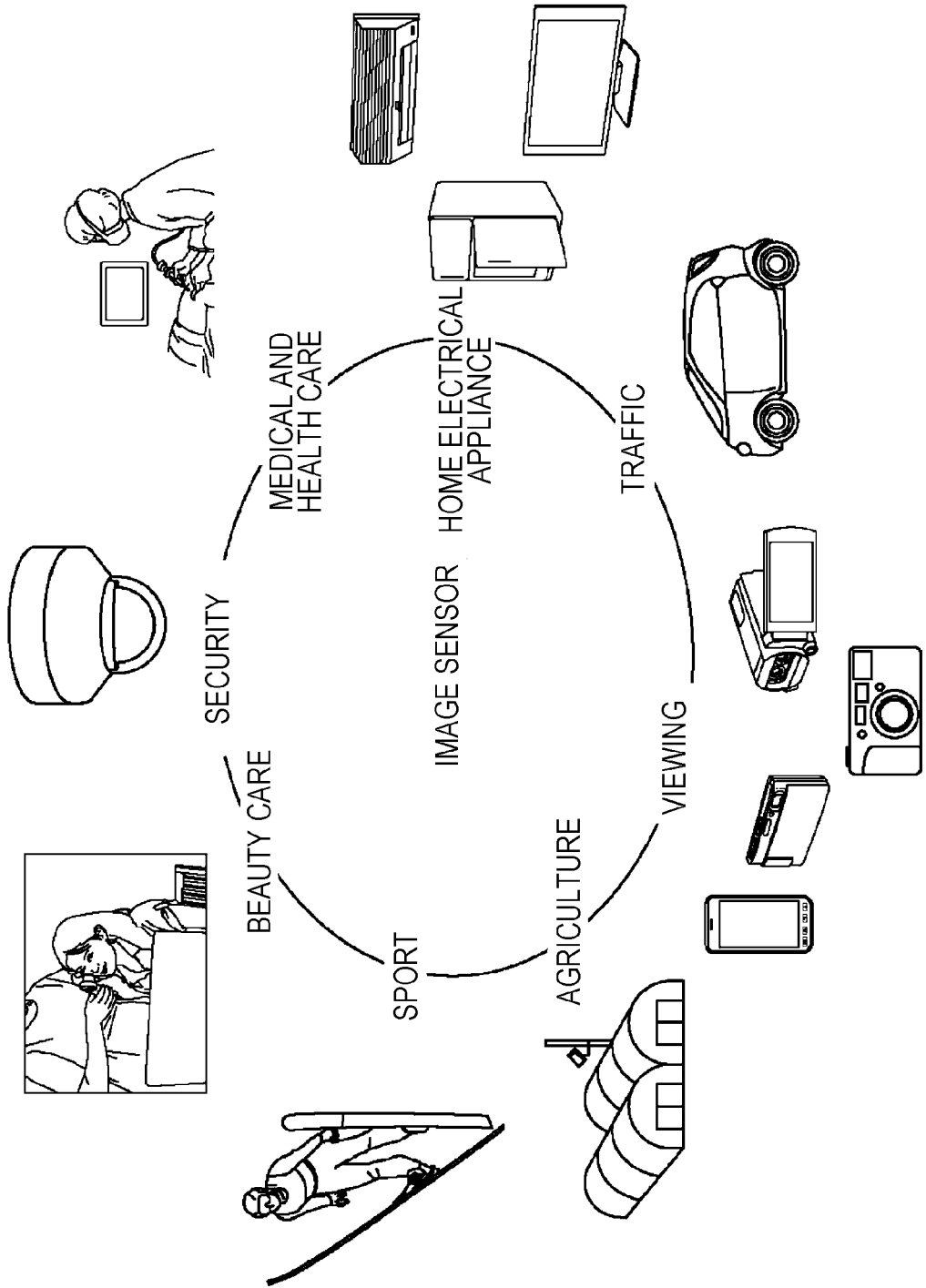
FIG. 13 is a diagram showing an application example of a technology according to the present disclosure.

The CMOS image sensor 1 according to the present embodiment described above can be used in various devices for example, for sensing light such as visible light, infrared light, ultraviolet light, or X-rays, as shown in FIG. 13. Specific examples of various devices are listed below.

A device for photographing an image to be used for viewing, such as a digital camera, a portable device with a camera function A device used for traffic purpose such as: an in-vehicle sensor for photographing the front, rear, surroundings, inside of a car, or the like of an automobile for safe driving such as automatic stop and recognition of driver's condition or the like; a surveillance camera for monitoring traveling vehicles and roads; and a distance measuring sensor that measures the distance between vehicles or the like A device used for a home electrical appliance such as TV, refrigerator, and air conditioner, to photograph user's gesture and perform equipment operation according to the gesture A device used for medical and health care, such as an endoscope, or a device for performing angiography by receiving infrared light A device used for security such as a surveillance camera, and a camera for person authentication A device used for beauty care such as a skin measuring instrument for photographing skin, and a microscope for photographing the scalp A device used for sport such as an action camera or a wearable camera for sports applications or the like A device used for agriculture such as a camera for monitoring the condition of fields and crops Application Example of Technology According to the Present Disclosure The technology according to the present disclosure can be applied to various products. A more specific application example will be described below.

[Electronic Device of the Present Disclosure]

Here, a case will be described where the technology according to the present disclosure is applied to an imaging device such as a digital still camera or a video camera, a mobile terminal device having an imaging function such as a mobile phone, or an electronic device such as a copying machine using an imaging element in an image reading part.

(Imaging Device)

Figure 14:
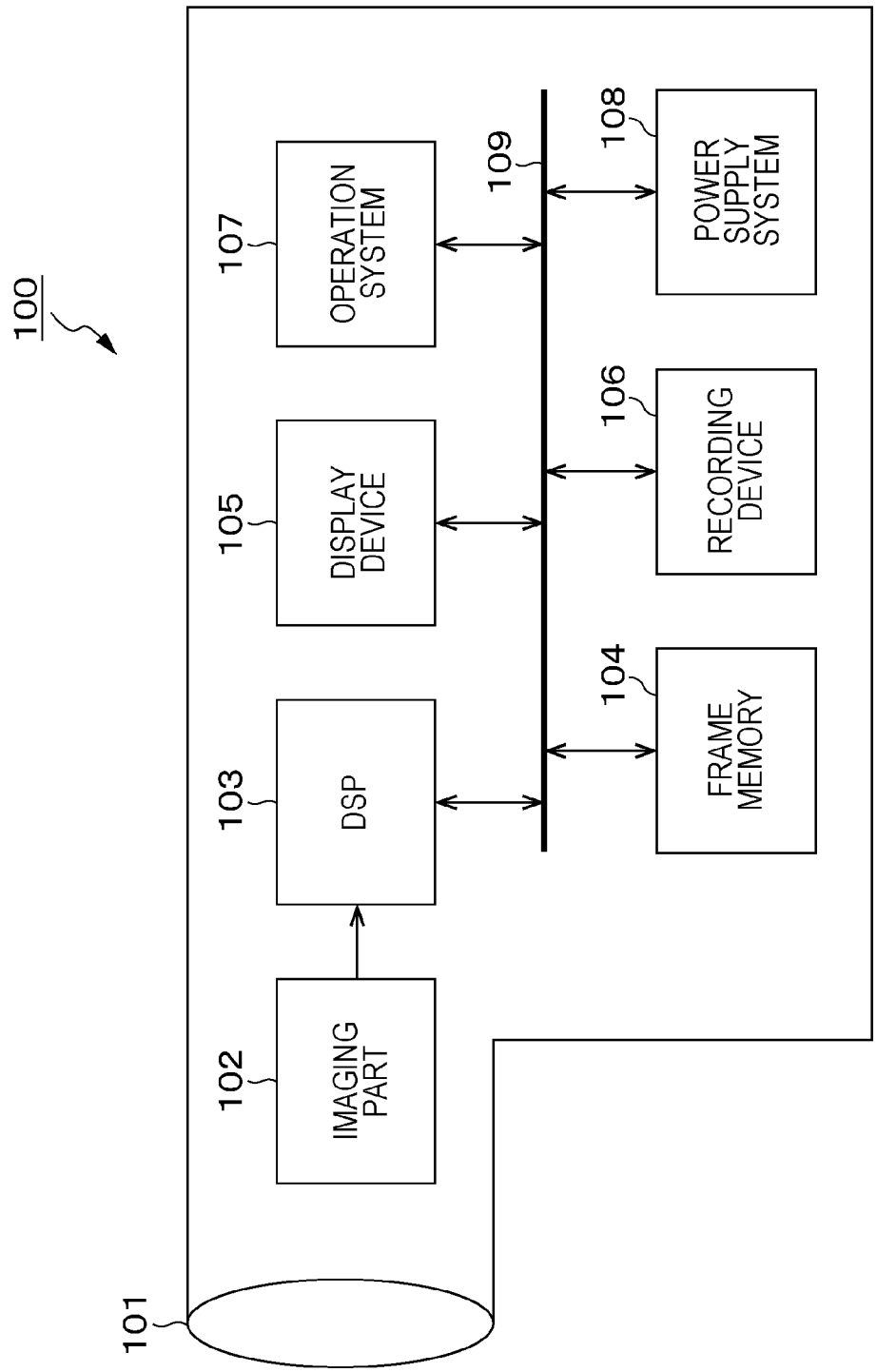
FIG. 14 is a block diagram showing a configuration of an imaging device which is an example of an electronic device of the present disclosure.

FIG. 14 is a block diagram showing a configuration of an imaging device which is an example of an electronic device of the present disclosure. As shown in FIG. 14, an imaging device 100 according to the present example includes an imaging optical system 101 including a lens group and the like, an imaging part 102, a digital signal processor (DSP) circuit 103, a frame memory 104, a display device 105, and a recording device 106, an operation system 107, a power supply system 108, and the like. Then, the DSP circuit 103, the frame memory 104, the display device 105, the recording device 106, the operation system 107, and the power supply system 108 are connected to each other via a bus line 109.

The imaging optical system 101 captures incident light (image light) from a subject and forms an image on the imaging surface of the imaging part 102. The imaging part 102 converts the light amount of the incident light formed as the image on the imaging surface by the optical system 101 into an electric signal for each pixel, and outputs the electric signal as a pixel signal. The DSP circuit 103 performs general camera signal processing, such as white balance processing, demosaic processing, and gamma correction processing, for example.

The frame memory 104 is used to appropriately store data in the process of signal processing in the DSP circuit 103. The display device 105 includes a panel-type display device such as a liquid crystal display device or an organic electro luminescence (EL) display device, and displays a moving image or a still image captured by the imaging part 102. The recording device 106 records the moving image or the still image captured by the imaging part 102 on a recording medium such as a portable semiconductor memory, an optical disc, or a hard disk drive (HDD).

The operation system 107 issues operation commands for various functions of the imaging device 100 under the operation of the user. The power supply system 108 appropriately supplies various power supplies serving as operation power supplies of the DSP circuit 103, the frame memory 104, the display device 105, the recording device 106, and the operation system 107 to these supply targets.

In the imaging device 100 having the configuration described above, the CMOS image sensor 1 to which the above-described technology according to the present disclosure is applied can be used as the imaging part 102. Since the CMOS image sensor 1 can perform analog-digital conversion with lower noise, it is possible to obtain a high-quality captured image with less noise.

[Application to Indirect TOF Distance Image Sensor]

The technology according to the present disclosure can be applied to an indirect indirect-time of flight (TOF) distance image sensor, in addition to the imaging element such as the CMOS image sensor described above. The indirect TOF distance image sensor is a sensor that measures the distance to an object by measuring the light flight time on the basis of the detection of the arrival phase difference of the reflected light from the light emitted from the light source and reflected on the object.

System Configuration Example

Figure 15:
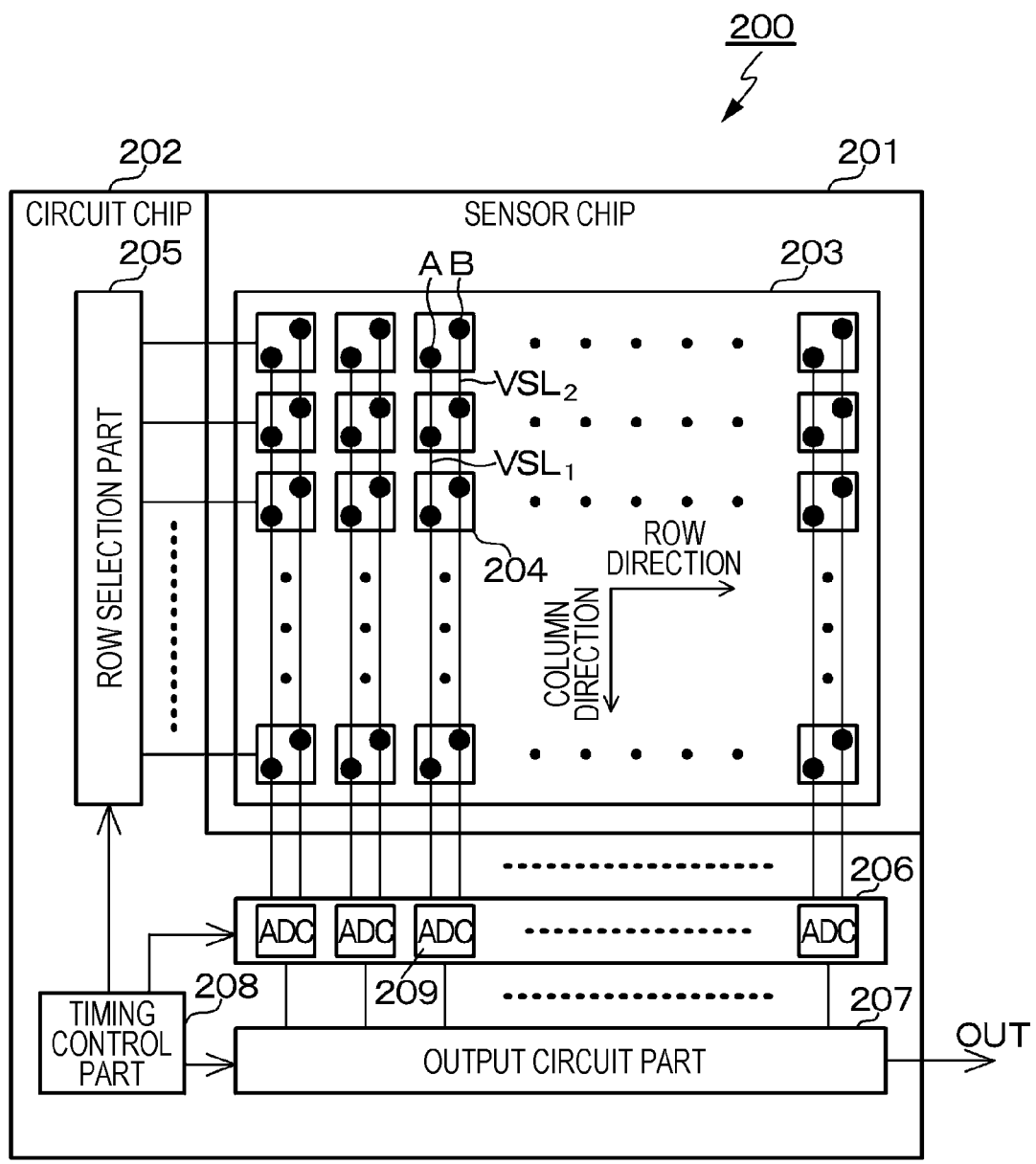
FIG. 15 is a block diagram showing an example of a system configuration of an indirect TOF distance image sensor to which the technology according to the present disclosure is applied.

FIG. 15 is a block diagram showing an example of a system configuration of an indirect TOF distance image sensor to which the technology according to the present disclosure is applied.

As shown in FIG. 15, the indirect TOF distance image sensor 200 has a stacked structure including a sensor chip 201 and a circuit chip 202 stacked on the sensor chip 201. In this stacked structure, the sensor chip 201 and the circuit chip 202 are electrically connected to each other through a connection part (not shown) such as a via or a Cu—Cu connection. Note that FIG. 15 illustrates a state in which the wiring of the sensor chip 201 and the wiring of the circuit chip 202 are electrically connected to each other via the connection part described above.

A pixel array part 203 is formed on the sensor chip 201. The pixel array part 203 includes a plurality of pixels 204 arranged in a matrix (array) in a two-dimensional grid pattern on the sensor chip 201. In the pixel array part 203, each of the plurality of pixels 204 receives infrared light, performs photoelectric conversion, and outputs an analog pixel signal. In the pixel array part 203, two vertical signal lines $VSL_1$ and $VSL_2$ are wired for each pixel column. When the number of pixel columns in the pixel array part 203 is M (M is an integer), a total of 2×M vertical signal lines VSL are wired in the pixel array part 203.

Each of the plurality of pixels 204 has two taps A and B (the details of which will be described later). Of the two vertical signal lines $VSL_1$ and $VSL_2$, the pixel signal $AIN_{P1}$ based on the charge of the tap A of the pixel 204 of the corresponding pixel column is output to the vertical signal line $VSL_1$, and the pixel signal $AIN_{P2}$ based on the charge of the tap B of the pixel 204 in the corresponding column is output to the vertical signal line $VSL_2$. The pixel signals $AIN_{P1}$ and $AIN_{P2}$ will be described later.

A row selection part 205, a column signal processing part 206, an output circuit part 207, and a timing control part 208 are arranged on the circuit chip 202. The row selection part 205 drives each pixel 204 of the pixel array part 203 in units of pixel rows and outputs pixel signals $AIN_{P1}$ and $AIN_{P2}$. Under the drive of the row selection part 205, the pixel signals $AIN_{P1}$ and $AIN_{P2}$ output from the pixels 204 of the selected row are supplied to the column signal processing part 206 through the vertical signal lines $VSL_1$ and $VSL_2$.

The column signal processing part 206 has a configuration including, for example, a plurality of analog-digital converters (ADC) 209 provided for each pixel column, corresponding to the pixel column of the pixel array part 203. The analog-digital converter 209 performs analog-digital conversion processing on the pixel signals $AIN_{P1}$ and $AIN_{P2}$ supplied through the vertical signal lines $VSL_1$ and $VSL_2$, and outputs the pixel signals $AIN_{P1}$ and $AIN_{P2}$ to the output circuit part 207. The output circuit part 207 performs CDS processing or the like on the digitized pixel signals $AIN_{P1}$ and $AIN_{P2}$ output from the column signal processing part 206, and outputs them to the outside of the circuit chip 202.

The timing control part 208 generates various timing signals, clock signals, control signals, and the like, and performs drive control of the row selection part 205, the column signal processing part 206, the output circuit part 207, and the like on the basis of these signals.

(Pixel Circuit Configuration Example)

Figure 16:
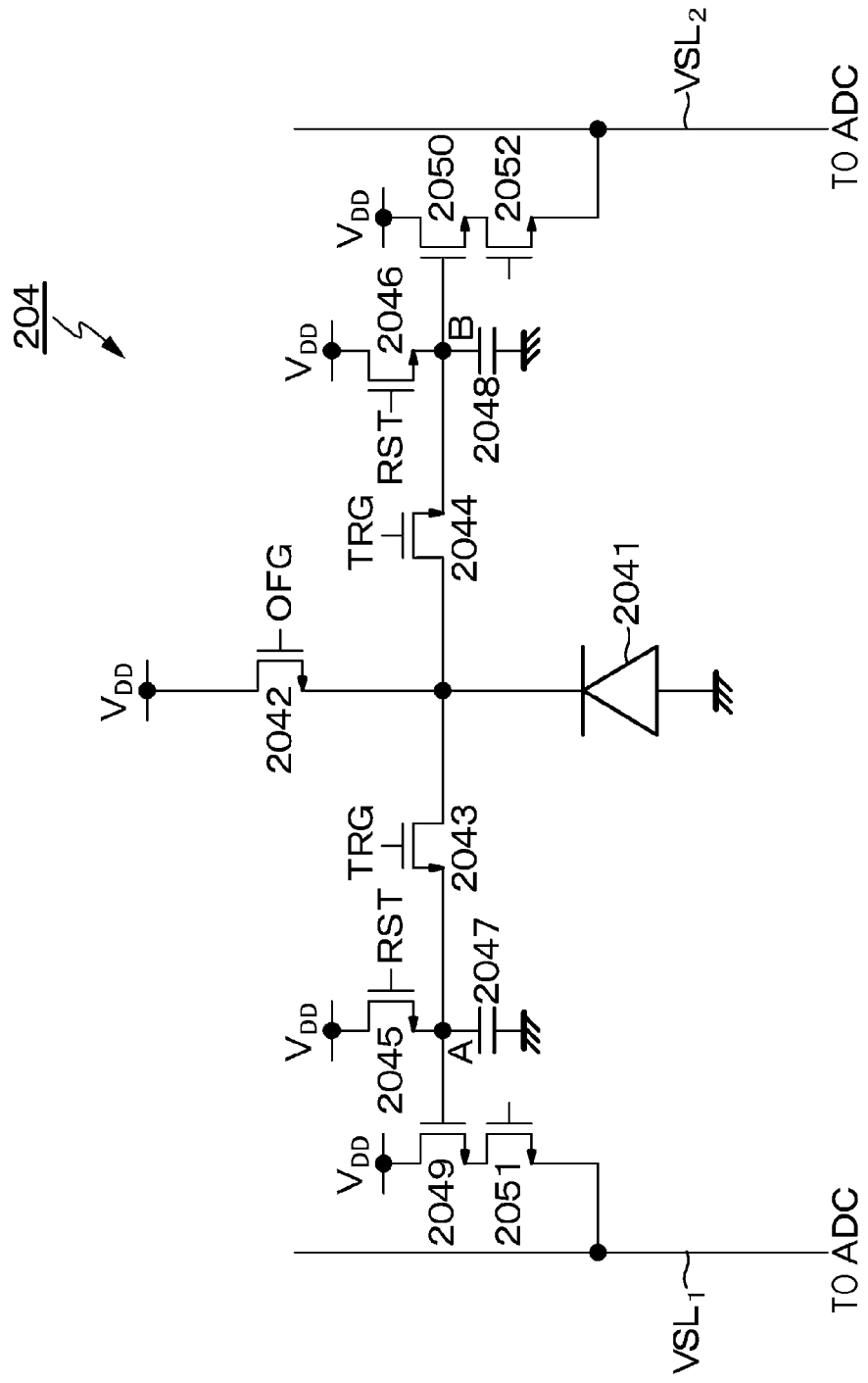
FIG. 16 is a circuit diagram showing an example of a circuit configuration of a pixel in the indirect TOF distance image sensor to which the technology according to the present disclosure is applied.

FIG. 16 is a circuit diagram showing an example of a circuit configuration of the pixel 204 in the indirect TOF distance image sensor 200 to which the technology according to the present disclosure is applied.

The pixel 204 according to this example has, for example, a photodiode 2041 as a photoelectric conversion part. The pixel 204 has a configuration including, in addition to the photodiode 2041, an overflow transistor 2042, two transfer transistors 2043, 2044, two reset transistors 2045 and 2046, two floating diffusion layers 2047 and 2048, two amplification transistors 2049 and 2050, and two selection transistors 2051 and 2052. The two floating diffusion layers 2047 and 2048 correspond to the taps A and B shown in FIG. 15.

The photodiode 2041 photoelectrically converts the received light to generate an electric charge. The photodiode 2041 can have a backside illumination pixel structure. The backside illumination structure is as described in the pixel structure of the CMOS image sensor. However, the structure is not limited to the backside illumination structure, and a frontside illumination structure in which light emitted from the front surface side of the substrate is taken in may be used.

The overflow transistor 2042 is connected between the cathode electrode of the photodiode 2041 and the power supply line of the power supply voltage $V_{DD}$, and has a function of resetting the photodiode 2041. Specifically, the overflow transistor 2042 becomes conductive in response to an overflow gate signal OFG supplied from the row selection part 205, and sequentially discharges the charges of the photodiode 2041 to the power supply line.

The two transfer transistors 2043 and 2044 are connected between the cathode electrode of the photodiode 2041 and each of the two floating diffusion layers 2047 and 2048. Then, the transfer transistors 2043 and 2044 become conductive in response to the transfer signal TRG supplied from the row selection part 205, so that the electric charges generated in the photodiode 2041 are sequentially transferred to each of the floating diffusion layers 2047 and 2048.

The floating diffusion layers 2047 and 2048 corresponding to the taps A and B accumulate the electric charges transferred from the photodiode 2041 and convert the electric charges into voltage signals having a voltage value corresponding to the amount of electric charges to generate pixel signals $AIN_{P1}$ and $AIN_{P2}$.

The two reset transistors 2045 and 2046 are connected between each of the two floating diffusion layers 2047 and 2048 and the power supply line of the power supply voltage $V_{DD}$. Then, the reset transistors 2045 and 2046 become conductive in response to the reset signal RST supplied from the row selection part 205, so that electric charges are extracted from the floating diffusion layers 2047 and 2048, respectively, and the charge amount is initialized.

The two amplification transistors 2049 and 2050 are connected between the power supply line of the power supply voltage $V_{DD}$ and each of the two selection transistors 2051 and 2052, and amplify the voltage signal that has been converted into the electric charge voltage by each of the floating diffusion layers 2047 and 2048.

The two selection transistors 2051 and 2052 are connected between each of the two amplification transistors 2049 and 2050 and each of the vertical signal lines $VSL_1$ and $VSL_2$. Then, the selection transistors 2051 and 2052 become conductive in response to the selection signal SEL supplied from the row selection part 205, so that the voltage signals amplified by the amplification transistors 2049 and 2050 are output the two vertical signal lines $VSL_1$ and $VSL_2$ as the pixel signals $AIN_{P1}$ and $AIN_{P2}$.

The two vertical signal lines $VSL_1$ and $VSL_2$ are connected to the input end of one analog-digital converter 209 in the column signal processing circuit 206 for each pixel column, and the pixel signals $AIN_{P1}$ and $AIN_{P2}$ output from the pixel 204 for each pixel column are transmitted to the analog-digital converter 209.

Note that the circuit configuration of the pixel 204 is not limited to the circuit configuration illustrated in FIG. 16 as long as it is a circuit configuration capable of generating the pixel signals $AIN_{P1}$ and $AIN_{P2}$ by photoelectric conversion.

In the indirect TOF distance image sensor 200 having the configuration described above, the technology according to the present disclosure can be applied to each analog-digital converter 209 provided in the column signal processing part 206. That is, the successive approximation resistor type analog-digital converters according to the first to fourth embodiments can be used as each analog-digital converter 209 of the column signal processing part 206.

Application Example to Mobile Body

The technology according to the present disclosure can be applied to various products. For example, the technology according to the present disclosure may be realized as an imaging device mounted on any type of mobile body such as an automobile, electric vehicle, hybrid electric vehicle, motorcycle, bicycle, personal mobility, airplane, drone, ship, robot, construction machine, or agricultural machine (tractor).

Figure 17:
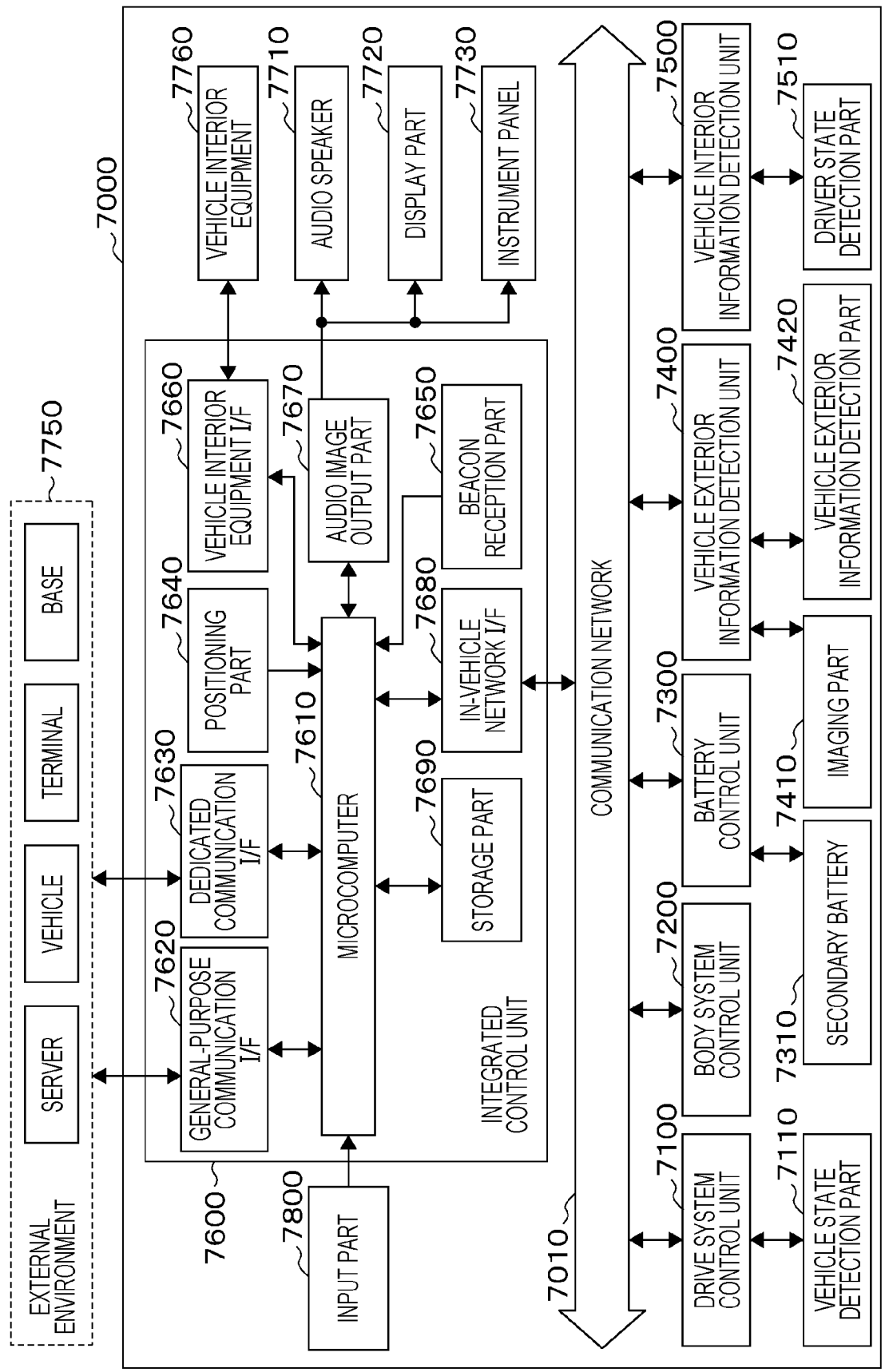
FIG. 17 is a block diagram showing a schematic configuration example of a vehicle control system which is an example of a mobile body control system to which the technology according to the present disclosure can be applied.

FIG. 17 is a block diagram showing a schematic configuration example of a vehicle control system 7000 which is an example of a mobile body control system to which the technology according to the present disclosure can be applied. The vehicle control system 7000 includes a plurality of electronic control units connected via a communication network 7010. In the example shown in FIG. 17, the vehicle control system 7000 includes a drive system control unit 7100, a body system control unit 7200, a battery control unit 7300, a vehicle exterior information detection unit 7400, a vehicle interior information detection unit 7500, and an integrated control unit 7600. The communication network 7010 connecting the plurality of control units may be, for example, an in-vehicle communication network conforming to an arbitrary standard such as the controller area network (CAN), the local interconnect network (LIN), the local area network (LAN), or the FlexRay (registered trademark).

Each control unit includes a microcomputer that performs operation processing according to various programs, a storage part that stores programs executed by the microcomputer, parameters used for various operations, or the like, and a drive circuit that drives devices subjected to various control. Each control unit includes a network I/F for communicating with another control unit via the communication network 7010, and includes a communication I/F for communication by wired communication or wireless communication with vehicle interior or exterior device, a sensor, or the like. FIG. 17 shows, as functional configuration of the integrated control unit 7600, a microcomputer 7610, a general-purpose communication I/F 7620, a dedicated communication I/F 7630, a positioning part 7640, a beacon reception part 7650, vehicle interior equipment I/F 7660, an audio image output part 7670, an in-vehicle network I/F 7680, and a storage part 7690. Similarly, each of the other control units includes a microcomputer, a communication I/F, a storage part, and the like.

The drive system control unit 7100 controls the operation of the device related to the drive system of the vehicle according to various programs. For example, the drive system control unit 7100 functions as a control device of a driving force generation device for generating a drive force of a vehicle such as an internal combustion engine or a driving motor, a drive force transmission mechanism for transmitting a drive force to wheels, a steering mechanism that adjusts a wheeling angle of the vehicle, a braking device that generates a braking force of the vehicle, and the like. The drive system control unit 7100 may have a function as a control device such as antilock brake system (ABS), or an electronic stability control (ESC).

A vehicle state detection part 7110 is connected to the drive system control unit 7100. The vehicle state detection part 7110 includes, for example, at least one of a gyro sensor that detects the angular velocity of the axis rotational motion of the vehicle body, an acceleration sensor that detects the acceleration of the vehicle, or a sensor for detecting an operation amount of an accelerator pedal, an operation amount of a brake pedal, steering of a steering wheel, an engine rotation speed, a wheel rotation speed, or the like. The drive system control unit 7100 performs operation processing using the signal input from the vehicle state detection part 7110 and controls the internal combustion engine, the driving motor, the electric power steering device, the brake device, or the like.

The body system control unit 7200 controls the operation of various devices mounted on the vehicle according to various programs. For example, the body system control unit 7200 functions as a keyless entry system, a smart key system, a power window device, or a control device for various lamps such as a head lamp, a back lamp, a brake lamp, a turn indicator, or a fog lamp. In this case, radio waves transmitted from a portable device that substitutes keys or signals of various switches may be input to the body system control unit 7200. The body system control unit 7200 receives input of these radio waves or signals and controls a door lock device, a power window device, a lamp, or the like of the vehicle.

The battery control unit 7300 controls a secondary battery 7310 that is a power supply source of the driving motor according to various programs. For example, information such as battery temperature, a battery output voltage, or remaining capacity of the battery is input to the battery control unit 7300 from the battery device including the secondary battery 7310. The battery control unit 7300 performs arithmetic processing using these signals and controls the temperature adjustment of the secondary battery 7310, or the cooling device or the like included in the battery device.

The vehicle exterior information detection unit 7400 detects information outside the vehicle equipped with the vehicle control system 7000. For example, at least one of the imaging part 7410 or the vehicle exterior information detection part 7420 is connected to the vehicle exterior information detection unit 7400. The imaging part 7410 includes at least one of a time of flight (ToF) camera, a stereo camera, a monocular camera, an infrared camera, or other cameras. The vehicle exterior information detection part 7420 includes, for example, at least one of an environmental sensor for detecting the current weather or climate, or an ambient information detection sensor for detecting another vehicle, an obstacle, a pedestrian, or the like around the vehicle equipped with the vehicle control system 7000.

The environmental sensor may be, for example, at least one of a raindrop sensor that detects rain, a fog sensor that detects mist, a sunshine sensor that detects sunshine degree, or a snow sensor that detects snowfall. The ambient information detection sensor may be at least one of an ultrasonic sensor, a radar device, or a light detection and ranging, laser imaging detection and ranging (LIDAR) device. The imaging part 7410 and the vehicle exterior information detection part 7420 may be provided as independent sensors or devices, respectively, or may be provided as a device in which a plurality of sensors or devices is integrated.

Figure 18:
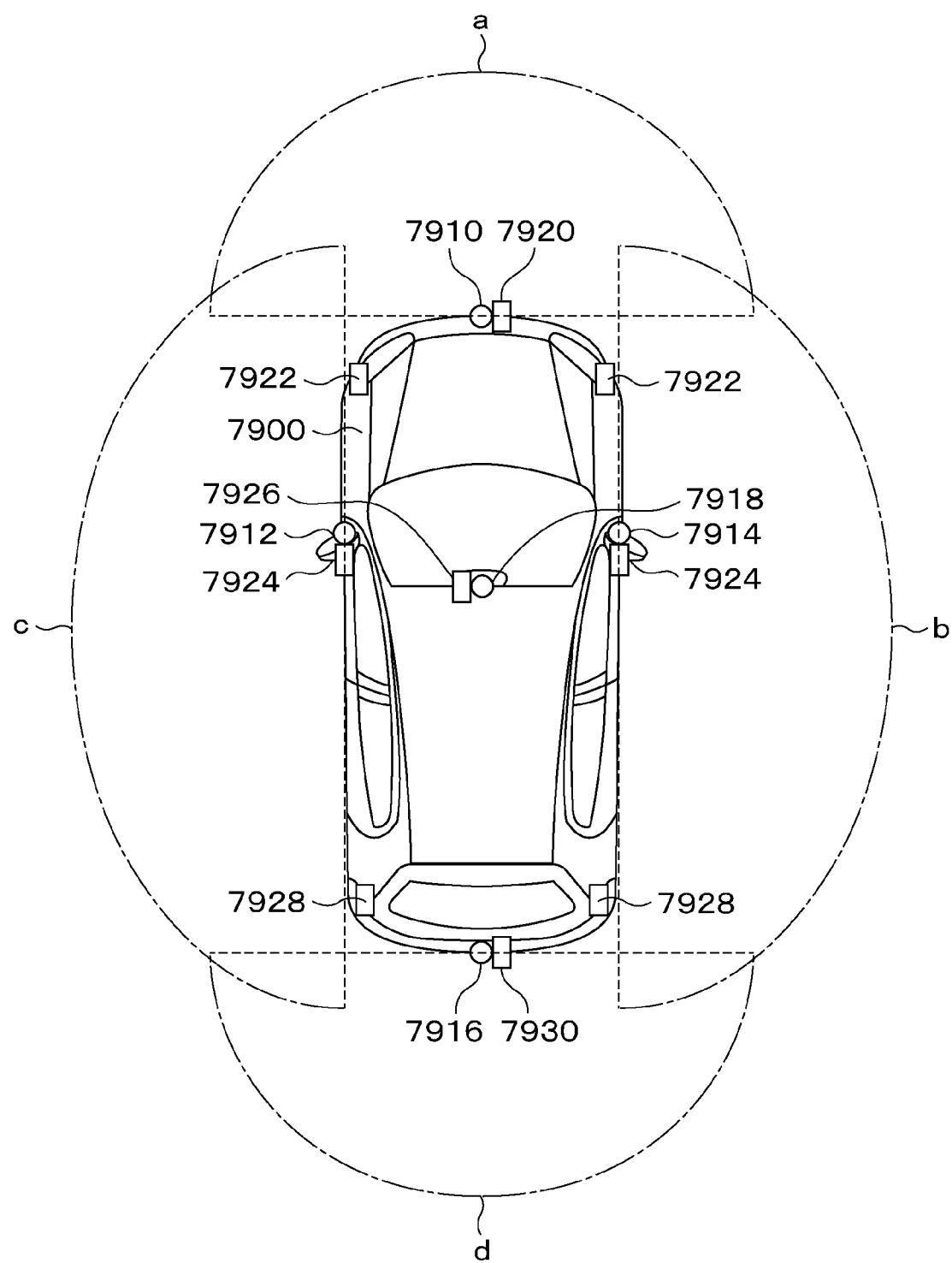
FIG. 18 is a diagram showing an example of an installation position of an imaging part.

Here, FIG. 18 shows an example of installation positions of the imaging part 7410 and the vehicle exterior information detection part 7420. Imaging parts 7910, 7912, 7914, 7916, and 7918 are provided at, for example, at least one of a front nose, a side mirror, a rear bumper, or a back door of the vehicle 7900, or an upper portion of a windshield in the vehicle compartment. The imaging part 7910 provided in the front nose and the imaging part 7918 provided in the upper portion of the windshield in the vehicle compartment mainly acquire an image ahead of the vehicle 7900. The imaging parts 7912 and 7914 provided in the side mirror mainly acquire an image of the side of the vehicle 7900. The imaging part 7916 provided in the rear bumper or the back door mainly acquires an image behind the vehicle 7900. The imaging part 7918 provided on the upper portion of the windshield in the vehicle compartment is mainly used for detecting a preceding vehicle, a pedestrian, an obstacle, a traffic signal, a traffic sign, a lane, or the like.

Note that FIG. 18 shows an example of the imaging ranges of the imaging parts 7910, 7912, 7914, and 7916. An imaging range a indicates the imaging range of the imaging part 7910 provided in the front nose, imaging ranges b and c indicate the imaging ranges of the imaging parts 7912 and 7914 provided in the side mirror, respectively, and an imaging range d indicates the imaging range of the imaging part 7916 provided in the rear bumper or the back door. For example, by superimposing the image data imaged by the imaging parts 7910, 7912, 7914, and 7916, an overhead view image of the vehicle 7900 viewed from above is obtained.

The vehicle exterior information detection parts 7920, 7922, 7924, 7926, 7928, and 7930 provided on the front, rear, side, or corner of the vehicle 7900 and the windshield in the upper portion of the vehicle compartment may be ultrasonic sensors or radar devices, for example. The vehicle exterior information detection parts 7920, 7926, and 7930 provided at the front nose, the rear bumper, or the back door of the vehicle 7900, and the upper portion of the windshield of the vehicle compartment may be the LIDAR device, for example. These vehicle exterior information detection parts 7920 to 7930 are mainly used for detecting a preceding vehicle, a pedestrian, an obstacle, or the like.

Returning to FIG. 17, the description will be continued. The vehicle exterior information detection unit 7400 causes the imaging part 7410 to image an image of the exterior of the vehicle and receives the imaged image data. Furthermore, the vehicle exterior information detection unit 7400 receives the detection information from the connected vehicle exterior information detection part 7420. In a case where the vehicle exterior information detection part 7420 is an ultrasonic sensor, a radar device, or a LIDAR device, the vehicle exterior information detection unit 7400 transmits ultrasonic waves, electromagnetic waves, or the like, and receives information of the received reflected waves. The vehicle exterior information detection unit 7400 may perform object detection processing of a person, a car, an obstacle, a sign, a character on a road surface, or the like, or distance detection processing on the basis of the received information. The vehicle exterior information detection unit 7400 may perform environment recognition processing for recognizing rainfall, fog, road surface condition, or the like on the basis of the received information. The vehicle exterior information detection unit 7400 may calculate the distance to the object outside the vehicle on the basis of the received information.

Furthermore, the vehicle exterior information detection unit 7400 may perform image recognition processing of recognizing a person, a car, an obstacle, a sign, a character on a road surface, or the like, or distance detection processing, on the basis of the received image data. The vehicle exterior information detection unit 7400 performs processing such as distortion correction or positioning on the received image data and synthesizes the image data imaged by different imaging parts 7410 to generate an overhead view image or a panorama image. The vehicle exterior information detection unit 7400 may perform viewpoint conversion processing using image data imaged by different imaging parts 7410.

The vehicle interior information detection unit 7500 detects vehicle interior information. For example, a driver state detection part 7510 that detects the state of the driver is connected to the vehicle interior information detection unit 7500. The driver state detection part 7510 may include a camera for imaging the driver, a biometric sensor for detecting the biological information of the driver, a microphone for collecting sound in the vehicle compartment, and the like. The biometric sensor is provided on, for example, a seating surface, a steering wheel, or the like, and detects biometric information of an occupant sitting on a seat or a driver holding a steering wheel. The vehicle interior information detection unit 7500 may calculate the degree of fatigue or the degree of concentration of the driver on the basis of the detection information input from the driver state detection part 7510, and may determine whether or not the driver is sleeping. The vehicle interior information detection unit 7500 may perform processing such as noise canceling processing on the collected sound signal.

The integrated control unit 7600 controls the overall operation of the vehicle control system 7000 according to various programs. An input part 7800 is connected to the integrated control unit 7600. The input part 7800 is realized by a device such as a touch panel, a button, a microphone, a switch, or a lever that can be input operated by an occupant, for example. Data obtained by performing speech recognition on the sound input by the microphone may be input to the integrated control unit 7600. The input part 7800 may be, for example, a remote control device using infrared rays or other radio waves, or an external connection device such as a mobile phone or a personal digital assistant (PDA) corresponding to the operation of the vehicle control system 7000. The input part 7800 may be, for example, a camera, in which case the occupant can input information by gesture. Alternatively, data obtained by detecting the movement of the wearable device worn by the occupant may be input. Moreover, the input part 7800 may include, for example, an input control circuit or the like that generates an input signal on the basis of information input by an occupant or the like using the input part 7800 and outputs the input signal to the integrated control unit 7600. By operating the input part 7800, an occupant or the like inputs various data or gives an instruction on processing operation to the vehicle control system 7000.

The storage part 7690 may include a read only memory (ROM) that stores various programs to be executed by the microcomputer, and a random access memory (RAM) that stores various parameters, operation results, sensor values, or the like. Furthermore, the storage part 7690 may be realized by a magnetic storage device such as a hard disc drive (HDD), a semiconductor storage device, an optical storage device, a magneto-optical storage device, or the like.

The general-purpose communication I/F 7620 is a general-purpose communication I/F that mediates communication with various devices existing in an external environment 7750. A cellular communication protocol such as global system of mobile communications (GSM) (registered trademark), WiMAX, long term evolution (LTE), or LTE-advanced (LTE-A), or other wireless communication protocols such as a wireless LAN (Wi-Fi (registered trademark)), or Bluetooth (registered trademark), may be implemented in the general-purpose communication I/F 7620. The general-purpose communication I/F 7620 may be connected to a device (for example, an application server or a control server) existing on an external network (for example, the Internet, a cloud network, or a company specific network) via a base station or an access point, for example. Furthermore, the general-purpose communication I/F 7620 uses, for example, the peer to peer (P2P) technology and may be connected with a terminal existing in the vicinity of the vehicle (for example, a terminal of a driver, a pedestrian, or a shop, or a machine type communication (MTC) terminal).

The dedicated communication I/F 7630 is a communication I/F supporting a communication protocol formulated for use in a vehicle. For example, in the dedicated communication I/F 7630, a standard protocol such as the wireless access in vehicle environment (WAVE) that is combination of lower layer IEEE 802.11p and upper layer IEEE 1609, the dedicated short range communications (DSRC), or the cellular communication protocol may be implemented. Typically, the dedicated communication I/F 7630 performs V2X communication that is concept including one or more of a vehicle to vehicle communication, a vehicle to infrastructure communication, a vehicle to home communication, and a vehicle to pedestrian communication.

The positioning part 7640 receives, for example, a global navigation satellite system (GNSS) signal from a GNSS satellite (for example, a global positioning system (GPS) signal from a GPS satellite) and performs positioning, to generate position information including the latitude, longitude, and altitude of the vehicle. Note that the positioning part 7640 may specify the current position by exchanging signals with the wireless access point or may acquire the position information from a terminal such as a mobile phone, a PHS, or a smartphone having a positioning function.

The beacon reception part 7650 receives, for example, radio waves or electromagnetic waves transmitted from a radio station or the like installed on the road, and acquires information such as the current position, congestion, road closure, or required time. Note that the function of the beacon reception part 7650 may be included in the dedicated communication I/F 7630 described above.

The vehicle interior equipment I/F 7660 is a communication interface that mediates connection between the microcomputer 7610 and various interior equipment 7760 existing in the vehicle. The vehicle interior equipment I/F 7660 may establish a wireless connection using a wireless communication protocol such as wireless LAN, Bluetooth (registered trademark), near field communication (NFC), or a wireless USB (WUSB). Furthermore, the vehicle interior equipment I/F 7660 may establish wired connection such as a universal serial bus (USB), a high-definition multimedia interface (HDMI (registered trademark)), or a mobile high-definition link (MHL) via a connection terminal not shown (and a cable if necessary). The vehicle interior equipment 7760 may include, for example, at least one of a mobile device or a wearable device possessed by an occupant, or an information device carried in or attached to the vehicle. Furthermore, the vehicle interior equipment 7760 may include a navigation device that performs a route search to an arbitrary destination. The vehicle interior equipment I/F 7660 exchanges control signals or data signals with these vehicle interior equipment 7760.

The in-vehicle network I/F 7680 is an interface mediating communication between the microcomputer 7610 and the communication network 7010. The in-vehicle network I/F 7680 transmits and receives signals and the like according to a predetermined protocol supported by the communication network 7010.

The microcomputer 7610 of the integrated control unit 7600 controls the vehicle control system 7000 in accordance with various programs on the basis of information acquired via at least one of the general-purpose communication I/F 7620, the dedicated communication I/F 7630, the positioning part 7640, the beacon reception part 7650, the vehicle interior equipment I/F 7660, or the in-vehicle network I/F 7680. For example, the microcomputer 7610 may operate a control target value of the drive force generation device, the steering mechanism, or the braking device on the basis of acquired information inside and outside the vehicle, and output a control command to the drive system control unit 7100. For example, the microcomputer 7610 may perform cooperative control for the purpose of function realization of an advanced driver assistance system (ADAS) including collision avoidance or impact mitigation of the vehicle, follow-up running based on inter-vehicle distance, vehicle speed maintenance running, vehicle collision warning, vehicle lane departure warning, or the like. Furthermore, the microcomputer 7610 may perform cooperative control for the purpose of automatic driving or the like by which a vehicle autonomously runs without depending on the operation of the driver by controlling the drive force generation device, the steering mechanism, the braking device, or the like on the basis of the acquired information on the surroundings of the vehicle.

The microcomputer 7610 may generate three-dimensional distance information between the vehicle and an object such as a surrounding structure or a person on the basis of the information acquired via at least one of the general-purpose communication I/F 7620, the dedicated communication I/F 7630, the positioning part 7640, the beacon reception part 7650, the vehicle interior equipment I/F 7660, or the in-vehicle network I/F 7680, and create local map information including peripheral information on the current position of the vehicle. Furthermore, the microcomputer 7610 may predict danger such as collision of a vehicle, approach of a pedestrian or the like, or entry into a road where traffic is stopped on the basis of acquired information to generate a warning signal. The warning signal may be, for example, a signal for generating an alarm sound or for turning on a warning lamp.

The audio image output part 7670 transmits an output signal of at least one of audio or image to an output device capable of visually or audibly notifying the occupant of the vehicle or the outside of the vehicle, of information. In the example of FIG. 17, as an output device, an audio speaker 7710, a display part 7720, and an instrument panel 7730 are illustrated. The display part 7720 may include at least one of an on-board display or a head-up display, for example. The display part 7720 may have an augmented reality (AR) display function. The output device may be other devices including a wearable device such as a headphone, a spectacular display worn by an occupant, a projector, a lamp, or the like other than these devices. In a case where the output device is a display device, the display device visually displays the result obtained by the various processing performed by the microcomputer 7610 or the information received from the other control unit in various formats such as text, image, table, or graph. Furthermore, in a case where the output device is an audio output device, the audio output device converts an audio signal including reproduced audio data, acoustic data, or the like into an analog signal, and outputs the result audibly.

Note that, in the example shown in FIG. 17, at least two control units connected via the communication network 7010 may be integrated as one control unit. Alternatively, each control unit may be constituted by a plurality of control units. Moreover, the vehicle control system 7000 may include another control unit not shown. Furthermore, in the above description, some or all of the functions carried out by any one of the control units may be performed by the other control unit. That is, as long as information is transmitted and received via the communication network 7010, predetermined operation processing may be performed by any control unit. Similarly, a sensor or device connected to any of the control units may be connected to another control unit, and a plurality of control units may transmit and receive detection information to and from each other via the communication network 7010.

An example of the vehicle control system to which the technology according to the present disclosure can be applied has been described above. For example, the technology according to the present disclosure can be applied to the imaging parts 7910, 7912, 7914, 7916, and 7918 and the vehicle exterior information detection parts 7920, 7922, 7924, 7926, 7928, and 7930, among the configurations described above. Then, by applying the technology according to the present disclosure, it is possible to obtain a high-quality captured image with less noise by reducing the noise of the successive approximation resistor type analog-digital converter used for the imaging element, so that, for example, a vehicle control system that can detect an imaging target with high accuracy can be constructed.

<Configuration that the Present Disclosure can Have>

Note that, the present disclosure can also have the following configuration.

<<A. Imaging Element>>

[A-1] An imaging element including:

a successive approximation resistor type analog-digital converter that converts an analog signal output from a pixel including a photoelectric conversion part into a digital signal, in which the successive approximation resistor type analog-digital converter has a preamplifier having a band limiting function.

[A-2] The imaging element according to [A-1] described above, in which the successive approximation resistor type analog-digital converter includes a digital-analog converter that uses a capacitance element to convert a digital value after analog-digital conversion to an analog value, and sets the analog value to a comparison reference for comparison with an analog input voltage, and the digital-analog converter has a plurality of capacitance elements that is extra for performing analog-digital conversion again, and after performing the analog-digital conversion for all bits, performs the analog-digital conversion again.

[A-3] The imaging element according to [A-1] described above, in which the successive approximation resistor type analog-digital converter includes a digital-analog converter that uses a capacitance element to convert a digital value after analog-digital conversion to an analog value, and sets the analog value to a comparison reference for comparison with an analog input voltage, and in the digital-analog converter, one of capacitance elements of lower bits includes a plurality of capacitance elements, and after the analog-digital conversion is performed for all bits, at least a first reference voltage to a fourth reference voltage are selectively applied to each of the plurality of capacitance elements, so that analog-digital conversion is performed again for the lower bits.

[A-4] The imaging element according to [A-2] described above or [A-3] described above, in which the preamplifier performs band limitation at least during a period for performing the analog-digital conversion again.

[A-5] The imaging element according to [A-2] described above or [A-3] described above, in which the preamplifier performs band limitation only during a period for performing the analog-digital conversion again.

[A-6] The imaging element according to any one of [A-1] described above to [A-5] described above, in which the preamplifier changes a resistance of a load to perform the band limitation.

[A-7] The imaging element according to any one of [A-1] described above to [A-5] described above, in which the preamplifier changes an output capacitance to ground to perform the band limitation.

[A-8] The imaging element according to any one of [A-1] described above to [A-5] described above, in which the preamplifier adds capacitance to between differential outputs to perform the band limitation.

[A-9] The imaging element according to any one of [A-1] described above to [A-5] described above, in which the preamplifier has a variable capacitance diode connected to an output node, and controls a capacitance of the variable capacitance diode to perform the band limitation.

[A-10] The imaging element according to any one of [A-1] described above to [A-5] described above, in which the preamplifier controls a current source bias or a number of current sources to be driven to perform the band limitation.

<<B. Imaging Element>>

[B-1] An imaging element including a successive approximation resistor type analog-digital converter that converts an analog signal output from a pixel including a photoelectric conversion part into a digital signal, in which the successive approximation resistor type analog-digital converter has a digital-analog converter that uses a capacitance element to convert a digital value after analog-digital conversion to an analog value, and sets the analog value to a comparison reference for comparison with an analog input voltage, and in the digital-analog converter, one of capacitance elements of lower bits includes a plurality of capacitance elements, and after the analog-digital conversion is performed for all bits, at least a first reference voltage to a fourth reference voltage are selectively applied to each of the plurality of capacitance elements, so that the analog-digital conversion is performed again for the lower bits.

[B-2] The imaging element according to [B-1] described above, in which the digital-analog converter has a switch group that sequentially applies at least the first reference voltage to the fourth reference voltage to each of the plurality of capacitance elements, for each of the plurality of capacitance elements.

<<C. Electronic Device>>

[C-1] An electronic device including an imaging element including:

a successive approximation resistor type analog-digital converter that converts an analog signal output from a pixel including a photoelectric conversion part into a digital signal, in which the successive approximation resistor type analog-digital converter has a preamplifier having a band limiting function.

[C-2] The electronic device according to [C-1] described above, in which the successive approximation resistor type analog-digital converter includes a digital-analog converter that uses a capacitance element to convert a digital value after analog-digital conversion to an analog value, and sets the analog value to a comparison reference for comparison with an analog input voltage, and the digital-analog converter has a plurality of capacitance elements that is extra for performing analog-digital conversion again, and after performing the analog-digital conversion for all bits, performs analog-digital conversion again.

[C-3] The electronic device according to [C-1] described above, in which the successive approximation resistor type analog-digital converter includes a digital-analog converter that uses a capacitance element to convert a digital value after analog-digital conversion to an analog value, and sets the analog value to a comparison reference for comparison with an analog input voltage, and in the digital-analog converter, one of capacitance elements of lower bits includes a plurality of capacitance elements, and after the analog-digital conversion is performed for all bits, at least a first reference voltage to a fourth reference voltage are selectively applied to each of the plurality of capacitance elements, so that the analog-digital conversion is performed again for the lower bits.

[C-4] The electronic device according to [C-2] described above or [C-3] described above, in which the preamplifier performs band limitation at least during a period for performing the analog-digital conversion again.

[C-5] The electronic device according to [C-2] described above or [C-3] described above, in which the preamplifier performs band limitation only during a period for performing the analog-digital conversion again.

[C-6] The electronic device according to any one of [C-1] described above to [C-5] described above, in which the preamplifier changes a resistance of a load to perform the band limitation.

[C-7] The electronic device according to any one of [C-1] described above to [C-5] described above, in which the preamplifier limits changes an output capacitance to ground to perform the band limitation.

[C-8] The electronic device according to any one of [C-1] described above to [C-5] described above, in which the preamplifier adds capacitance to between differential outputs to perform the band limitation.

[C-9] The electronic device according to any one of [C-1] described above to [C-5] described above, in which the preamplifier has a variable capacitance diode connected to an output node, and controls a capacitance of the variable capacitance diode to perform the band limitation.

[C-10] The electronic device according to any one of [C-1] described above to [C-5] described above,
in which the preamplifier controls a current source bias or a number of current sources to be driven to perform the band limitation.

<D. Electronic Device>>

[D-1] An electronic device including an imaging element including
a successive approximation resistor type analog-digital converter that converts an analog signal output from a pixel including a photoelectric conversion part into a digital signal,
in which the successive approximation resistor type analog-digital converter includes
a digital-analog converter that uses a capacitance element to convert a digital value after analog-digital conversion to an analog value, and sets the analog value to a comparison reference for comparison with an analog input voltage, and
in the digital-analog converter, one of capacitance elements of lower bits includes a plurality of capacitance elements, and after the analog-digital conversion is performed for all bits, at least a first reference voltage to a fourth reference voltage are selectively applied to each of the plurality of capacitance elements, so that the analog-digital conversion is performed again for the lower bits.

[D-2] The electronic device according to [D-1] described above,
in which the digital-analog converter has a switch group that sequentially applies at least the first reference voltage to the fourth reference voltage to each of the plurality of capacitance elements, for each of the plurality of capacitance elements.

REFERENCE SIGNS LIST

1 CMOS image sensor
2, 204 Pixel
11 Pixel array part
12, 205 Row selection part
13 Constant current source part
14 Analog-digital conversion part
15 Horizontal transfer scanning part
16 Signal processing part
17, 208 Timing control part
18 Horizontal transfer line
21 Photodiode (photoelectric conversion part)
22 Transfer transistor
23 Reset transistor
24 Amplification transistor
25 Selection transistor
31 ($31_1$ to $31_m$) Pixel drive line
32 ($32_1$ to $32_n$) Vertical signal line
50 Successive approximation resistor type analog-digital converter
51 Preamplifier
52 Comparator
53 SAR logic part
54, 54a, 54b SAR binary capacitance array part
55, 55a, 55b Capacitance array part for re-AD conversion
56 Switch matrix part
57 Reference voltage generation part
58a, 58b Reset switch
60 Capacitance DAC (digital-analog converter)
100 Imaging device
200 Indirect TOF distance image sensor

The invention claimed is:
1. An imaging element comprising:
a successive approximation resistor type analog-digital converter that converts an analog signal output from a pixel including a photoelectric conversion part into a digital signal,
wherein the successive approximation resistor type analog-digital converter has a preamplifier having a band limiting function, and
wherein the successive approximation resistor type analog-digital converter includes
a digital-analog converter that uses a capacitance element to convert a digital value after analog-digital conversion to an analog value, and sets the analog value to a comparison reference for comparison with an analog input voltage, and
the digital-analog converter has a plurality of capacitance elements for performing analog-digital conversion again, and after performing the analog-digital conversion for all bits, performs the analog-digital conversion again.
2. The imaging element according to claim 1,
wherein after the analog-digital conversion is performed for all bits, at least a first reference voltage to a fourth reference voltage are selectively applied to each of the plurality of capacitance elements, so that analog-digital conversion is performed again for the lower bits.
3. The imaging element according to claim 1,
wherein the preamplifier performs band limitation at least during a period for performing the analog-digital conversion again.
4. The imaging element according to claim 1,
wherein the preamplifier performs band limitation only during a period for performing the analog-digital conversion again.
5. The imaging element according to claim 1,
wherein the preamplifier changes a resistance of a load to perform the band limitation.
6. The imaging element according to claim 1,
wherein the preamplifier changes an output capacitance to ground to perform the band limitation.
7. The imaging element according to claim 1,
wherein the preamplifier adds capacitance to between differential outputs to perform the band limitation.
8. The imaging element according to claim 1,
wherein the preamplifier has a variable capacitance diode connected to an output node, and controls a capacitance of the variable capacitance diode to perform the band limitation.
9. The imaging element according to claim 1,
wherein the preamplifier controls a current source bias or a number of current sources to be driven to perform the band limitation.
10. An electronic device comprising an imaging element according to claim 1.
11. An imaging element comprising
a successive approximation resistor type analog-digital converter that converts an analog signal output from a pixel including a photoelectric conversion part into a digital signal,
wherein the successive approximation resistor type analog-digital converter has
a digital-analog converter that uses a capacitance element to convert a digital value after analog-digital conversion to an analog value, and sets the analog value to a comparison reference for comparison with an analog input voltage, and
in the digital-analog converter, one of capacitance elements of lower bits includes a plurality of capacitance elements, and after the analog-digital conversion is performed for all bits, at least a first reference voltage to a fourth reference voltage are selectively applied to each of the plurality of capacitance elements, so that the analog-digital conversion is performed again for the lower bits.

12. The imaging element according to claim 11,
wherein the digital-analog converter has a switch group that sequentially applies at least the first reference voltage to the fourth reference voltage to each of the plurality of capacitance elements, for each of the plurality of capacitance elements.

13. An electronic device comprising an imaging element including:
a successive approximation resistor type analog-digital converter that converts an analog signal output from a pixel including a photoelectric conversion part into a digital signal,
wherein the successive approximation resistor type analog-digital converter has a preamplifier having a band limiting function, and
wherein the successive approximation resistor type analog-digital converter includes
a digital-analog converter that uses a capacitance element to convert a digital value after analog-digital conversion to an analog value, and sets the analog value to a comparison reference for comparison with an analog input voltage, and
in the digital-analog converter, one of capacitance elements of lower bits includes a plurality of capacitance elements, and after the analog-digital conversion is performed for all bits, at least a first reference voltage to a fourth reference voltage are selectively applied to each of the plurality of capacitance elements, so that the analog-digital conversion is performed again for the lower bits.

14. An electronic device comprising an imaging element including
a successive approximation resistor type analog-digital converter that converts an analog signal output from a pixel including a photoelectric conversion part into a digital signal,
wherein the successive approximation resistor type analog-digital converter includes
a digital-analog converter that uses a capacitance element to convert a digital value after analog-digital conversion to an analog value, and sets the analog value to a comparison reference for comparison with an analog input voltage, and
in the digital-analog converter, one of capacitance elements of lower bits includes a plurality of capacitance elements, and after the analog-digital conversion is performed for all bits, at least a first reference voltage to a fourth reference voltage are selectively applied to each of the plurality of capacitance elements, so that the analog-digital conversion is performed again for the lower bits.

* * * * *